United States Patent
Oh et al.

(10) Patent No.: US 9,653,551 B2
(45) Date of Patent: May 16, 2017

(54) FIELD EFFECT TRANSISTORS INCLUDING FIN STRUCTURES WITH DIFFERENT DOPED REGIONS AND SEMICONDUCTOR DEVICES INCLUDING THE SAME

(71) Applicant: Samsung Electronics Co., Ltd., Suwon-si (KR)

(72) Inventors: Changwoo Oh, Suwon-Si (KR); Myung Gil Kang, Suwon-Si (KR); Bomsoo Kim, Seoul (KR); Jongshik Yoon, Yongin-Si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/980,134

(22) Filed: Dec. 28, 2015

(65) Prior Publication Data

US 2016/0181366 A1 Jun. 23, 2016

Related U.S. Application Data

(63) Continuation of application No. 13/615,671, filed on Sep. 14, 2012, now abandoned.

(30) Foreign Application Priority Data

Mar. 21, 2012 (KR) .......................... 10-2012-0028996

(51) Int. Cl.
*H01L 27/12* (2006.01)
*H01L 29/10* (2006.01)
(Continued)

(52) U.S. Cl.
CPC .. *H01L 29/1041* (2013.01); *H01L 21/823821* (2013.01); *H01L 21/845* (2013.01);
(Continued)

(58) Field of Classification Search
CPC ............. H01L 29/785; H01L 29/66795; H01L 2029/7858; H01L 27/1211; H01L 29/0649;
(Continued)

(56) References Cited

U.S. PATENT DOCUMENTS 7,154,118 B2  12/2006  Lindert et al.
7,531,423 B2   5/2009  Cheng et al.
(Continued)

FOREIGN PATENT DOCUMENTS

CN  101189730 A  5/2008
CN  101542743 A  9/2009
(Continued)

*Primary Examiner* — Khiem D Nguyen
(74) *Attorney, Agent, or Firm* — Ward and Smith, P.A.

(57) ABSTRACT

Field effect transistors are provided. According to the field effect transistor, a source region and a drain region are provided on a substrate and a fin portion is provided to protrude from the substrate. The fin portion connects the source region and the drain region to each other. A gate electrode pattern is disposed on the fin portion and extends to cross over the fin portion. A gate dielectric layer is disposed between the fin portion and the gate electrode pattern. A semiconductor layer is disposed between the fin portion and the gate dielectric layer. The semiconductor layer and the fin portion have dopant-concentrations different from each other, respectively.

19 Claims, 36 Drawing Sheets

(51) Int. Cl.
*H01L 21/84* (2006.01)
*H01L 21/8238* (2006.01)
*H01L 29/66* (2006.01)
*H01L 29/78* (2006.01)
*H01L 27/092* (2006.01)
*H01L 27/088* (2006.01)
*H01L 29/06* (2006.01)
*H01L 29/423* (2006.01)

(52) U.S. Cl.
CPC ...... *H01L 27/0886* (2013.01); *H01L 27/0924* (2013.01); *H01L 27/1211* (2013.01); *H01L 29/063* (2013.01); *H01L 29/0649* (2013.01); *H01L 29/0676* (2013.01); *H01L 29/42392* (2013.01); *H01L 29/66545* (2013.01); *H01L 29/785* (2013.01)

(58) Field of Classification Search
CPC . H01L 29/7848; H01L 21/76; H01L 29/7851; H01L 21/823421; H01L 27/0886; H01L 29/0847; H01L 21/845; H01L 29/41791
See application file for complete search history.

(56) References Cited

U.S. PATENT DOCUMENTS

| | | | |
|---|---|---|---|
| 7,902,014 B2 | 3/2011 | Doyle et al. | |
| 8,004,045 B2 | 8/2011 | Sasaki et al. | |
| 8,507,337 B2 | 8/2013 | Loo et al. | |
| 2005/0051812 A1* | 3/2005 | Dixit | H01L 29/1041 257/250 |
| 2005/0224800 A1 | 10/2005 | Lindert et al. | |
| 2005/0263795 A1 | 12/2005 | Choi et al. | |
| 2007/0090416 A1 | 4/2007 | Doyle et al. | |
| 2007/0278576 A1* | 12/2007 | Kim | H01L 29/66621 257/347 |
| 2007/0284634 A1 | 12/2007 | Yokoyama et al. | |
| 2008/0185691 A1* | 8/2008 | Cheng | H01L 29/0649 257/656 |
| 2009/0026540 A1 | 1/2009 | Sasaki et al. | |
| 2010/0044794 A1 | 2/2010 | Cheng | |
| 2010/0276761 A1 | 11/2010 | Tung et al. | |
| 2011/0059584 A1 | 3/2011 | Takeuchi et al. | |
| 2011/0121404 A1 | 5/2011 | Shifren et al. | |
| 2013/0056795 A1 | 3/2013 | Wu | |

FOREIGN PATENT DOCUMENTS

| | | |
|---|---|---|
| JP | 2007059427 | 3/2007 |
| JP | 2007305827 | 11/2007 |
| JP | 2009521113 | 5/2009 |
| JP | 2011527124 | 10/2011 |
| JP | 2005045245 | 2/2017 |

* cited by examiner

FIELD EFFECT TRANSISTORS INCLUDING FIN STRUCTURES WITH DIFFERENT DOPED REGIONS AND SEMICONDUCTOR DEVICES INCLUDING THE SAME

CROSS-REFERENCE TO RELATED APPLICATIONS

This U.S. non-provisional patent application is a continuation of U.S. patent application Ser. No. 13/615,671, filed Sep. 14, 2012, abandoned, and claims priority under 35 U.S.C. §119 to Korean Patent Application No. 10-2012-0028996, filed on Mar. 21, 2012, the contents of which are hereby incorporated herein by reference as set forth fully in their entireties.

BACKGROUND

The inventive concept relates to field effect transistors and semiconductor devices including the same.

Semiconductor devices may be attractive because of their small size, multi-function and/or low fabrication cost. Semiconductor devices can be categorized as semiconductor memory devices that store data, semiconductor logic devices that process data, and, hybrid semiconductor devices that function as semiconductor memory devices and as semiconductor logic devices. The characteristics of high reliability, high speed, and/or multi-function of these semiconductor devices may improve with the development of the electronics industry.

BRIEF DESCRIPTION OF THE DRAWINGS

The inventive concept will become more apparent in view of the attached drawings and accompanying detailed description.

SUMMARY

Figure 1:
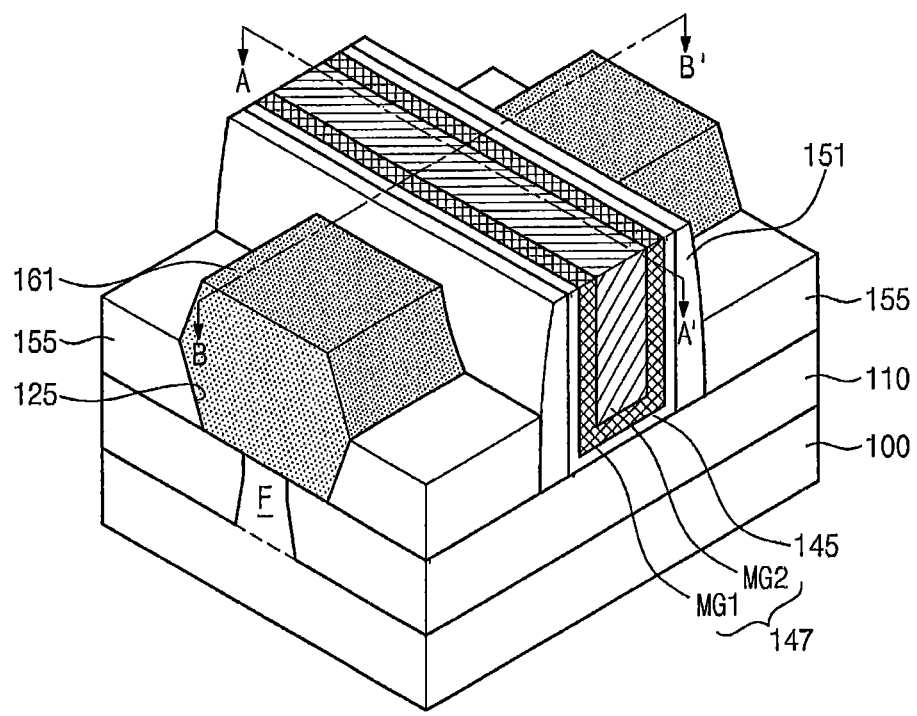
FIG. 1 is a perspective view illustrating a field effect transistor according to an embodiment of the inventive concept.

Embodiments according to the inventive concept can provide fin structures with different doped regions. Pursuant to these embodiments, a Field Effect Transistor (FET) structure can include a device isolation layer on a substrate and a fin that extends from the substrate to protrude from the device isolation layer. The fin can include a threshold voltage control region that is doped with a first concentration of impurities and a carrier region, on the threshold voltage control region, that is doped with a second concentration of impurities that is less than the first concentration of impurities.

In some embodiments according to the inventive concept, a total width of the fin including the threshold voltage control region and the carrier region is greater than about 10 nm and the threshold voltage control region includes an inner portion of the fin and the carrier region includes an outer portion of the fin grown on the inner portion.

In some embodiments according to the inventive concept, a total width of the fin including the threshold voltage control region and the carrier region is greater than about an amount where volume inversion occurs in the fin and the threshold voltage control region includes an inner portion of the fin and the carrier region includes an outer portion of the fin grown on the inner portion.

In some embodiments according to the inventive concept, the second concentration of impurities comprises diffused impurities from the first concentration of impurities. In some embodiments according to the inventive concept, the second concentration of impurities can be about 10 percent or less of the first concentration of impurities.

In some embodiments according to the inventive concept, a total width of the fin including the threshold voltage control region and the carrier region can be less than about 10 nm and wherein the carrier region includes an inner portion of the fin and the threshold voltage control region includes an outer portion of the fin grown on the inner portion.

In some embodiments according to the inventive concept, a total width of the fin including the threshold voltage control region and the carrier region can be less than an amount where volume inversion occurs in the fin and the carrier region includes an inner portion of the fin and the threshold voltage control region includes an outer portion of the fin grown on the inner portion.

In some embodiments according to the inventive concept, the second concentration of impurities can be diffused impurities from the first concentration of impurities. In some embodiments according to the inventive concept, the second concentration of impurities can be about 10 percent or less of the first concentration of impurities.

In some embodiments according to the inventive concept, Field Effect Transistor (FET) structure can include a device isolation layer on a substrate and a fin that includes an inner portion of the fin extending from the substrate to protrude from the device isolation layer to provide upper side walls and a top surface, the inner portion of the fin being doped with a first concentration of impurities to provide a threshold voltage control region and an outer portion of the fin, on the inner portion, that can include a semiconductor layer grown on the top surface and on the upper side walls of the inner portion of the fin, the semiconductor layer being doped with a second concentration of impurities that is less than the first concentration of impurities to provide a carrier region. A gate structure can cross over the fin.

In some embodiments according to the inventive concept, a semiconductor device can include a device isolation layer on a substrate where a first transistor that can include a first semiconductor structure that protrudes from the device isolation layer including a first semiconductor layer providing a first channel during operation of the first transistor and including a first threshold voltage control region doped heavier than the first semiconductor layer to provide a first threshold voltage. A first gate electrode and a first gate dielectric can cross over the first semiconductor structure. A second transistor can include a second semiconductor structure that protrudes from the device isolation layer including a second semiconductor layer providing a second channel during operation of the second transistor and including a second threshold voltage control region doped heavier than the second semiconductor layer to provide a second first threshold voltage. A second gate electrode and a second gate dielectric can cross over the second semiconductor structure, wherein the first and second threshold voltages can be different threshold voltages.

In some embodiments according to the inventive concept, a Field Effect Transistor (FET) structure can include a device isolation layer on a substrate and a fin that can have a total width less than about 10 nm, where the fin can include an inner portion of the fin that extends from the substrate to protrude from the device isolation layer to provide upper side walls, a top surface, and a channel region, the inner portion of the fin being doped with a first concentration of impurities. An outer portion of the fin can include a semiconductor layer grown on the top surface and on the upper side walls of the inner portion of the fin, the semiconductor layer being doped with a second concentration of impurities that is greater than the first concentration of impurities. A gate structure can cross over the fin opposite the channel region.

DETAILED DESCRIPTION OF THE EMBODIMENTS

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limiting the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Figure 2:
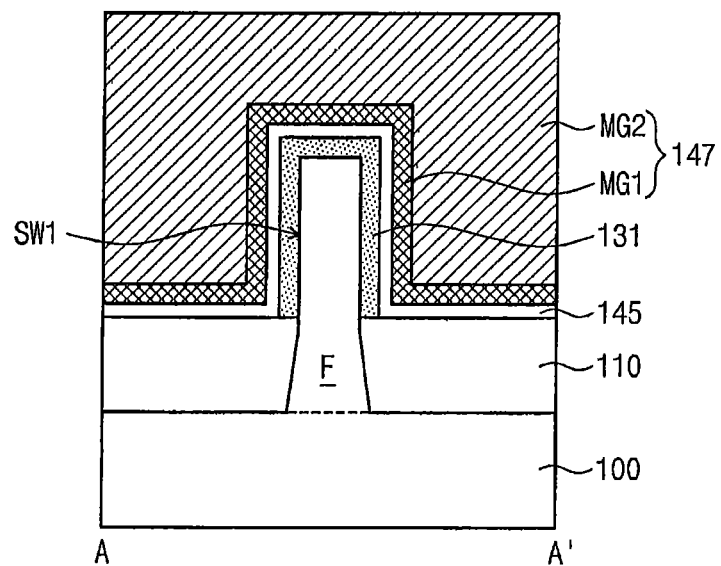
FIGS. 2 and 3 are cross-sectional views taken along a line A-A' and a line B-B' of FIG. 1, respectively.
Figure 3:
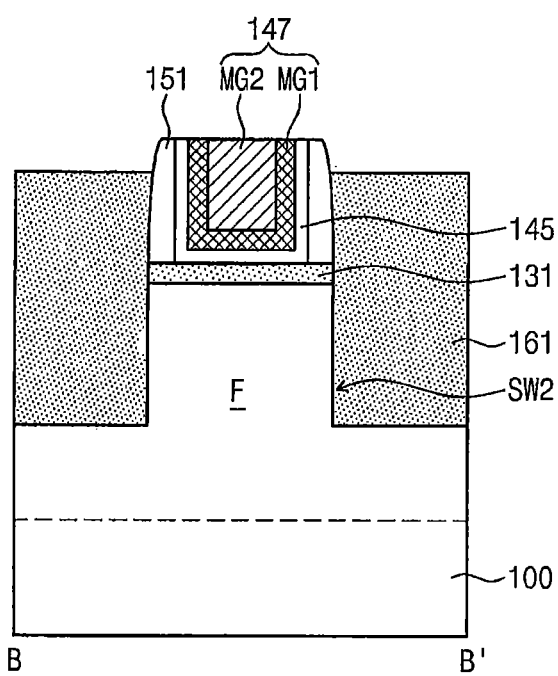
Figure 4:
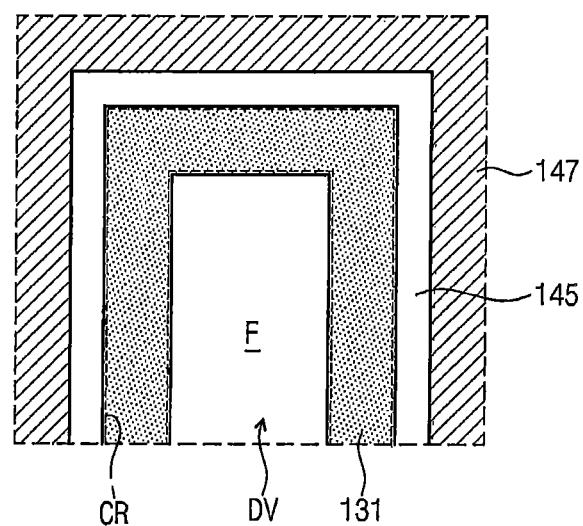
FIG. 4 is an enlarged view of a fin portion and a region adjacent to the fin portion of FIG. 2.

FIG. 1 is a perspective view illustrating a field effect transistor according to an embodiment of the inventive concept. FIGS. 2 and 3 are cross-sectional views taken along a line A-A' and a line B-B' of FIG. 1, respectively. FIG. 4 is an enlarged view of a fin portion and a region adjacent to the fin portion of FIG. 2.

A field effect transistor according to an embodiment of the inventive concept is described with reference to FIGS. 1 to 4. A fin F may be provided to protrude from a substrate 100. The substrate 100 may be a semiconductor substrate including silicon, germanium, or silicon-germanium. For example, the fin F may correspond to a portion of the substrate 100 but also may include an epitaxial layer (i.e., semiconductor layer) that is grown from the substrate 100. Accordingly, in some embodiments, an inner portion of the fin F may correspond to the portion of the substrate 100 that protrudes therefrom and an outer portion of the fin corresponds to the semiconductor layer that is grown on the inner portion of the fin F. The fin F may extend between device isolation layers 110 so as to protrude upward from a top surface of the substrate 100 to provide upper side walls of the fin F. The device isolation layers 110 may cover lower sidewalls of the fin F.

A gate electrode pattern 147 may be provided on the fin F. The gate electrode pattern 147 may extend in an X-axis direction. The gate electrode pattern 147 may include at least one metal layer. For example, the gate electrode pattern 147 may include a first sub-gate electrode MG1 and a second sub-gate electrode MG2, and each of the first and second sub-gate electrodes MG1 and MG2 may be a layer including a metal. The first sub-gate electrode MG1 may be provided under the second sub-gate electrode MG2 and may extend along sidewalls of the second sub-gate electrode MG2. The first sub-gate electrode MG1 may correspond to a metal layer for controlling a work function, and the second sub-gate electrode MG2 may correspond to a metal layer filling a space defined by the first sub-gate electrode MG1. Also, the first sub-gate electrode MG1 may include at least one of TiN, TaN, TiC, and TaC. For example, the second sub-gate electrode MG2 may include tungsten or aluminum. In other embodiments, the gate electrode pattern 147 may include silicon and/or germanium.

Figure 44:
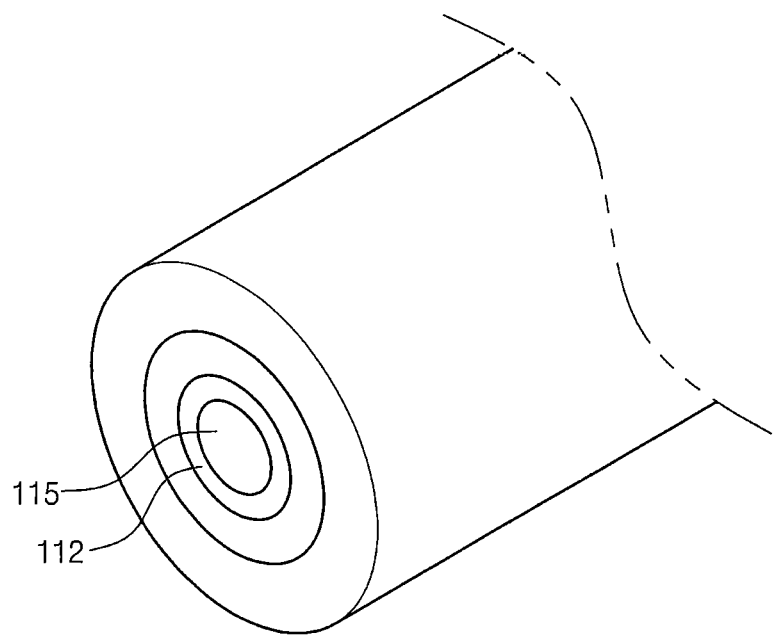
FIG. 44 is a perspective view of a gate-all-around type structure including a nanowire in some embodiments according to the inventive concept.

Although the portions of the structures described herein take the form of a fin, it will be understood that the different doping levels provided to threshold voltage control regions and carrier regions can be applied to other geometries such as a "gate-all-around" structure (such as a nanowire structure) and an "omega shaped" gate structure. FIG. 44 illustrates a nanowire structure 115 used to provide what is referred to herein as the fin F. Outer portions of the fin can be an epitaxially grown semiconductor layer 112 that may be less heavily doped than the nanowire structure 115 in some embodiments according to the invention.

Figure 45:
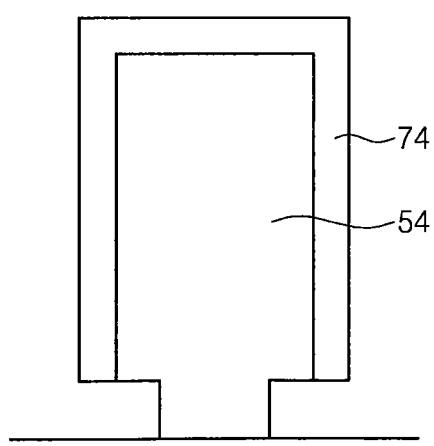
FIG. 45 is a cross-sectional view of an omega shaped gate structure in some embodiments according to the inventive concept.

Embodiments according to the inventive concept can also be provided in the form of omega shaped gate structures, such as those illustrated in FIG. 45, where the fin 54 takes the form of an omega shaped letter having a neck portion adjacent to the substrate which is narrower than an upper portion of the body of the omega shaped structure. Still further, the outer fin portion 74 formed thereon can also follow the profile of the sidewalls and top portion of the omega shaped fin 54 and can be an epi-grown semiconductor layer.

Furthermore the structures shown herein referred to as, for example, the fin can be active semiconductor layers, which are formed to have equivalent semiconductor properties as the fin structures. For example, the active semiconductor layer can be formed to include inner and outer portions that are doped differently as described herein. Other structures may also be used in embodiments according to the invention.

Referring again to FIGS. 1-4, a gate dielectric layer 145 may be provided between the fin F and the gate electrode pattern 147. The gate dielectric layer 145 may extend along upper sidewalls and a top surface of the fin F. For example, the gate dielectric layer 145 may extend between the gate electrode pattern 147 and the device isolation layers 110. The gate dielectric layer 145 may be provided between the fin F and the gate electrode pattern 147 and may extend along sidewalls of the gate electrode pattern 147. The gate dielectric layer 145 may include a high-k dielectric material having a dielectric constant greater than that of a silicon oxide layer. For example, the gate dielectric layer 145 may include $HfO_2$, $ZrO_2$, and/or $Ta_2O_5$. It will be understood that the gate electrode pattern 147 and the gate dielectric layer 145 may be referred to herein collectively as a gate structure.

A semiconductor layer (or a semiconductor region) 131 may be provided between the fin F and the gate dielectric layer 145. The semiconductor layer 131 may be provided in a crossing region of the gate electrode pattern 147 and the fin F. As illustrated in FIG. 2, the semiconductor layer 131 may extend onto a first upper sidewall SW1 of the fin F which faces the gate electrode pattern 147. In other words, the semiconductor layer 131 may be disposed along a surface of the fin F exposed by the device isolation layers 110. In some embodiments, as illustrated in FIG. 3, the semiconductor layer 131 may not be provided on a second upper sidewall SW2 of the fin F which faces a source/drain region 161, as described further below.

As illustrated in FIG. 4, the fin F may include a threshold voltage control doped region DV. The threshold voltage control doped region DV and the semiconductor layer 131 may be doped with dopants of the same conductivity type. In some embodiments, when the field effect transistor according to an embodiment of the inventive concept is a NMOS transistor, the dopant may be boron (B). In other embodiments, when the field effect transistor is a PMOS transistor, the dopant may be phosphorus (P) or arsenic (As). The semiconductor layer 131 and the threshold voltage control doped region DV may have dopant-concentrations that are different from each other, respectively. In some embodiments, the dopant-concentration of the semiconductor layer 131 may be less than the dopant-concentration of the threshold voltage control doped region DV.

In some embodiments, the semiconductor layer 131 (providing the outer portion of the fin F) may be substantially un-doped except those dopants diffused from the threshold voltage control doped region DV (i.e., the inner portion of the fin F). Even though initially the semiconductor layer 131 may not be substantially doped with dopants, due to the dopants diffused from the threshold voltage control doped region DV, the dopant-concentration of the semiconductor layer 131 may have a doping profile that continuously decreases rotating from a surface in contact with the fin F and proceeding to a surface in contact with the gate dielectric layer 145 of the semiconductor layer 131. Hereinafter, the substantially un-doped state means a state that is not substantially doped except with those diffused dopants as described above.

In other embodiments, the semiconductor layer 131 may be doped to have a dopant-concentration equal to or less than about a tenth of the dopant-concentration in the threshold voltage control doped region DV.

When the field effect transistor is operated, as illustrated in FIG. 4, a channel CR is formed in the semiconductor layer 131. When the semiconductor layer 131 having the relatively low dopant-concentration is used as a channel region of a transistor, an electric field applied to the channel region by the gate electrode pattern 147 is reduced due to the relatively low dopant-concentration of the semiconductor layer 131. Mobility of carriers may increase by the reduction of the electric field. Additionally, since the threshold voltage control doped region DV is spaced apart from the gate electrode pattern 147, distribution of threshold voltages may be improved. In some embodiments, the semiconductor layer 131 may be formed of the same material as the fin F. In other embodiments, the semiconductor layer 131 may be formed of a semiconductor material that is different from that of the fin F. For example, if the fin F is formed of silicon, the semiconductor layer 131 may include at least one of InSb, InAs, GaSb, InP, GaAs, Ge, SiGe, and SiC. The semiconductor layer 131 may include a semiconductor material having an energy band gap different from that of the fin F. For example, the fin F may include GaAs, and the semiconductor layer 131 may include AlGaAs.

Source/drain regions 161 may be disposed at both sides of the gate electrode pattern 147. The source/drain region 161 may be in contact with the second upper sidewall SW2 of the fin F. The source/drains regions 161 may be formed in recess regions 125 in an interlayer dielectric layer 155, respectively. In some embodiments, the source/drain regions 161 may be elevated source/drain shapes having top surfaces higher than a bottom surface of the gate electrode pattern 147. The source/drain regions 161 may be insulated from the gate electrode pattern 147 by spacers 151. For example, the spacers 151 may include at least one of a nitride layer and an oxynitride layer.

If the field effect transistor is a PMOS transistor, the source/drain regions 161 may be compressive stress patterns that apply a compressive stress to the semiconductor layer 131 and the fin F, such that the mobility of carriers in the channel region may be improved. For example, the compressive stress pattern may include a material (e.g., silicon-germanium (SiGe)) having a lattice constant greater than that of the material used as the fin F (e.g., silicon). Alternatively, if the field effect transistor is an NMOS transistor, the source/drain regions 161 may be formed of the same material as the substrate 100. For example, if the substrate 100 is a silicon substrate, the source/drain regions 161 may be formed of silicon.

In some embodiments of the inventive concept, the semiconductor layer 131 having the relatively low dopant-concentration is used as the channel, so that the mobility of carriers may be improved and the distribution of the threshold voltage may be improved. Additionally, due to the source/drain regions 161 having elevated shapes and/or the compressive stress pattern, the mobility of carriers may be further improved and the short channel effect of the field effect transistor may be improved.

FIGS. 5, 7, 9, and 11 are plan views of field effect transistors according to embodiments of the inventive concept. FIGS. 6, 8, 10, and 12 are cross-sectional views taken along lines C-C' of FIGS. 5, 7, 9, and 11, respectively.

In some embodiments according to the inventive concept, field effect transistors may be complementary metal-oxide-semiconductor (CMOS) transistors including a PMOS transistor and a NMOS transistor. Each of the PMOS transistor on a PMOS region and the NMOS transistor on a NMOS region may include a source region SR and a drain region DR on a substrate 100. Fins F1 and F2 may be provided to connect the source region SR and the drain region DR to each other. A first fin F1 may constitute a portion of the PMOS transistor. In other words, the first fin F1 may connect the source region SR and the drain region DR of the PMOS transistor to each other. A second fin F2 may constitute a portion of the NMOS transistor. In other words, the second fin F2 may connect the source region SR and the drain region DR of the NMOS transistor. A first gate dielectric layer 145 and a first gate electrode pattern 147 may be sequentially disposed on the first fin F1, and a second gate dielectric layer 146 and a second gate electrode pattern 148 may be sequentially disposed on the second fin F2. Each of the first and second fins F1 and F2 may extend in a first direction (e.g., a Y-axis direction) between the source region SR and the drain region DR. Each of the first and second gate electrode patterns 147 and 148 may extend in a second direction (e.g., an X-axis direction) crossing the first direction.

Figure 5:
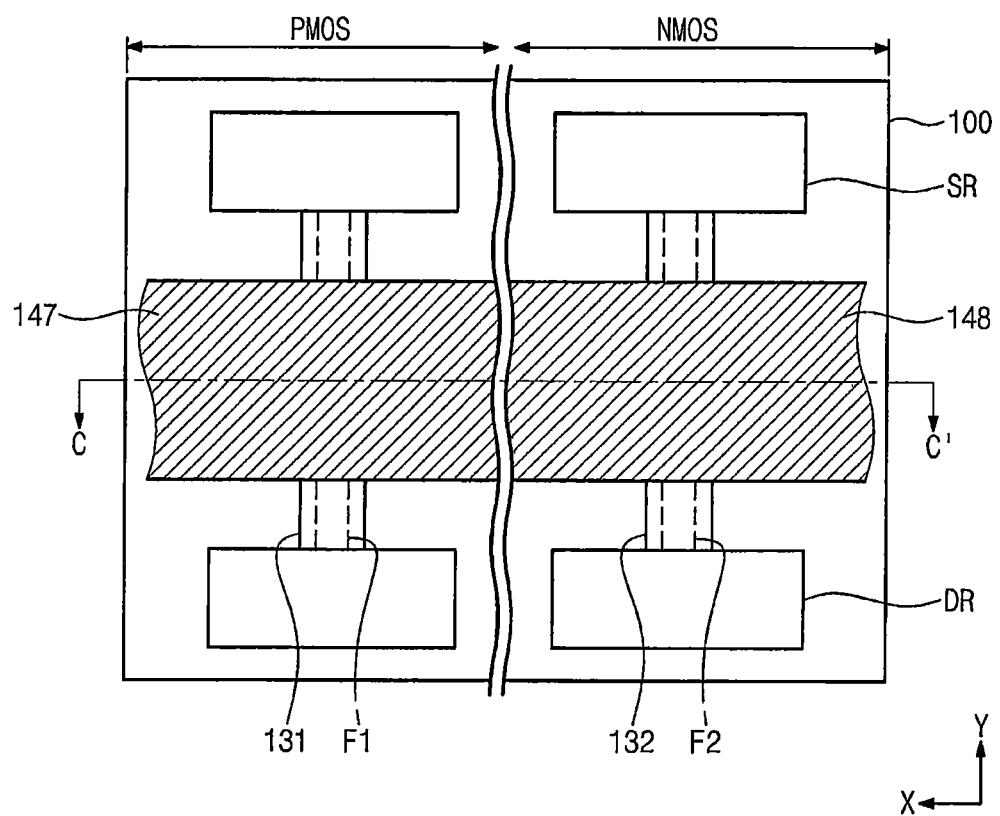
FIGS. 5, 7, 9, and 11 are plan views of field effect transistors according to embodiments of the inventive concept.
Figure 6:
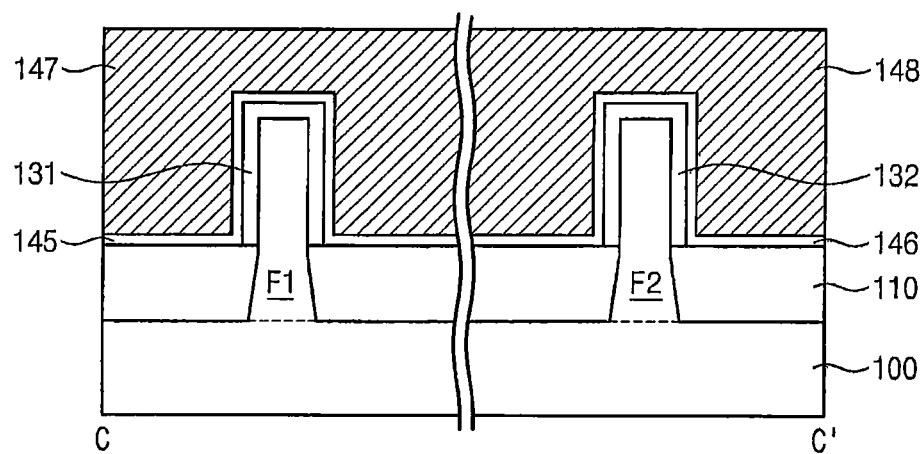
FIGS. 6, 8, 10, and 12 are cross-sectional views taken along lines C-C' of FIGS. 5, 7, 9, and 11, respectively.

A semiconductor layer may be provided on at least one of the first and second fins F1 and F2. The semiconductor layer may be provided to both the NMOS transistor and the PMOS transistor as illustrated in FIGS. 5 and 6. In other words, a first semiconductor layer 131 may be disposed between the first fin F1 and the first gate dielectric layer 145, and a second semiconductor layer 132 may be disposed between the second fin F2 and the second gate dielectric layer 146.

Figure 7:
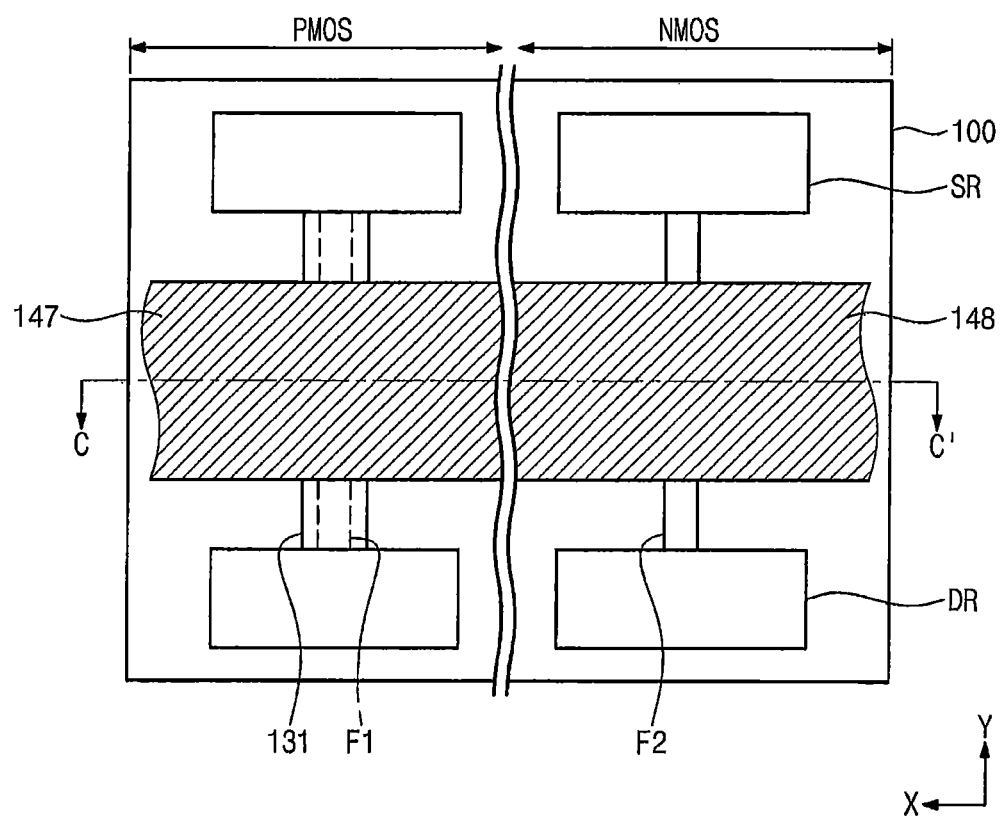
Figure 8:
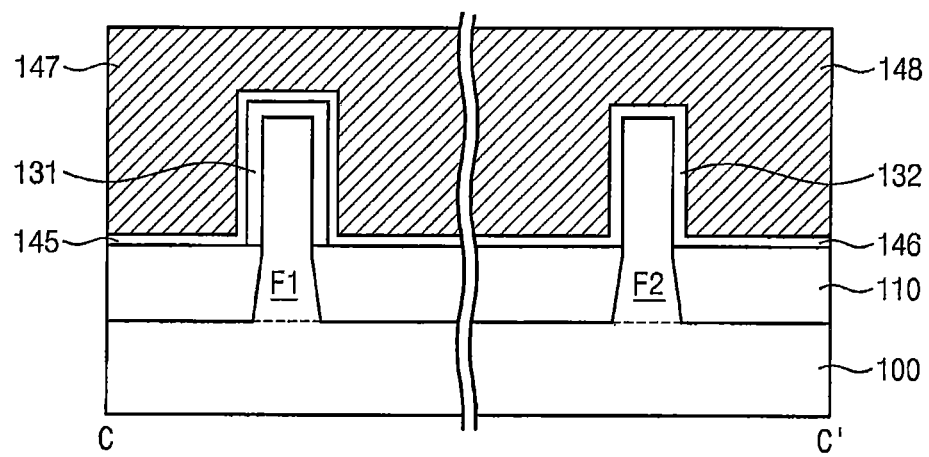
Figure 9:
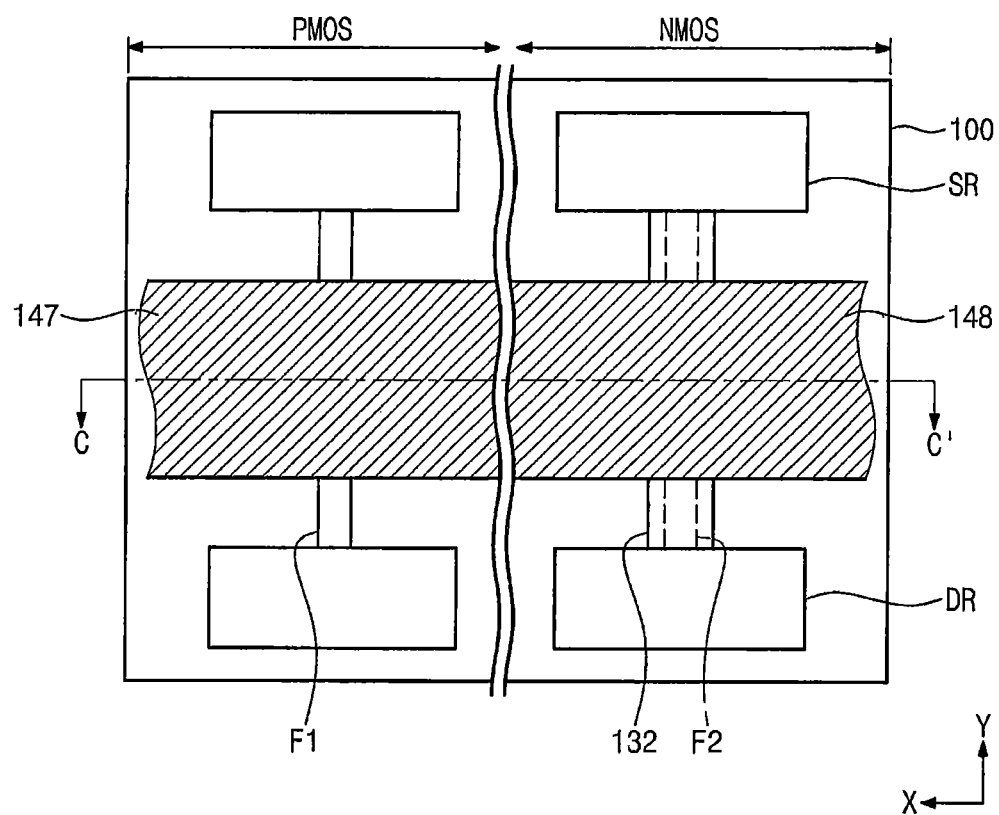
Figure 10:
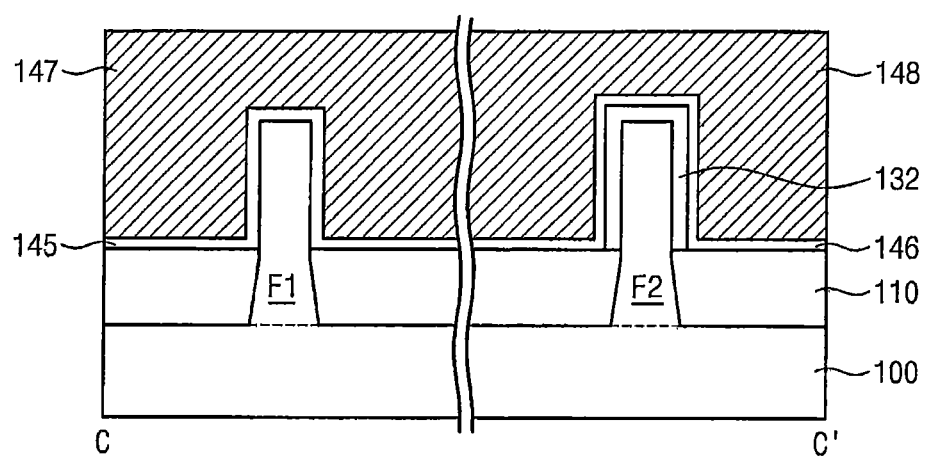

Alternatively, a semiconductor layer may be provided on only one of the NMOS transistor and PMOS transistor. In other words, the semiconductor layer may be provided on only the PMOS transistor as illustrated in FIGS. 7 and 8, or the semiconductor layer may be provided on only the NMOS transistor as illustrated in FIGS. 9 and 10.

Figure 11:
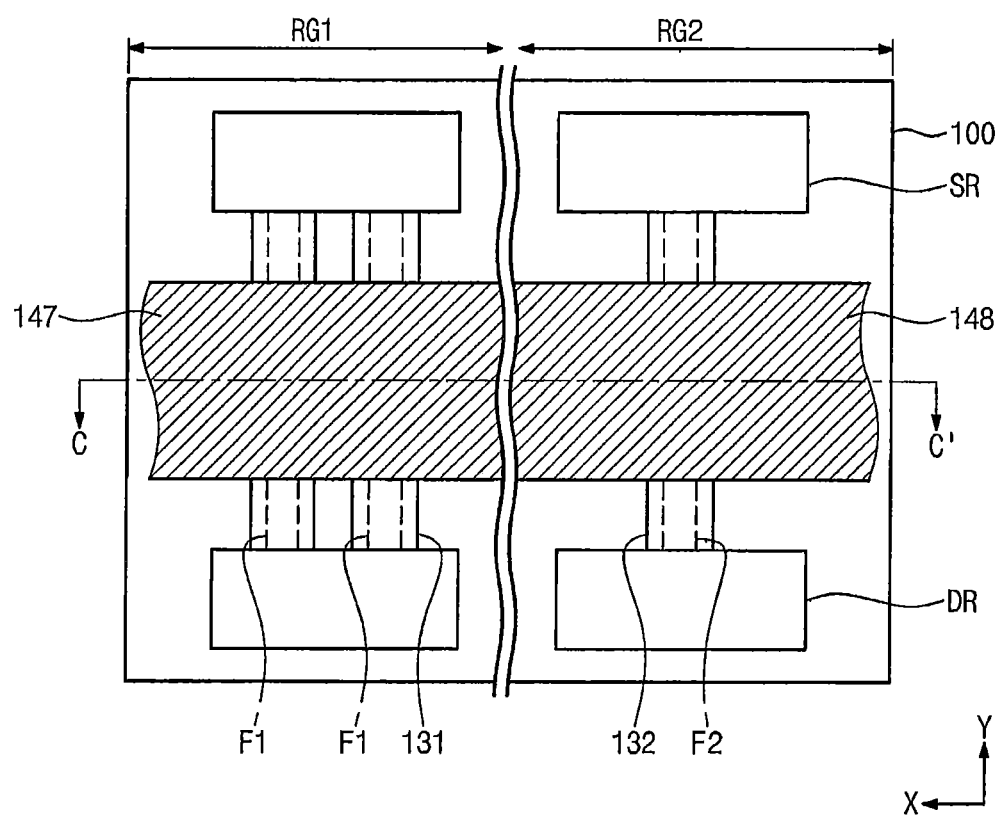
Figure 12:
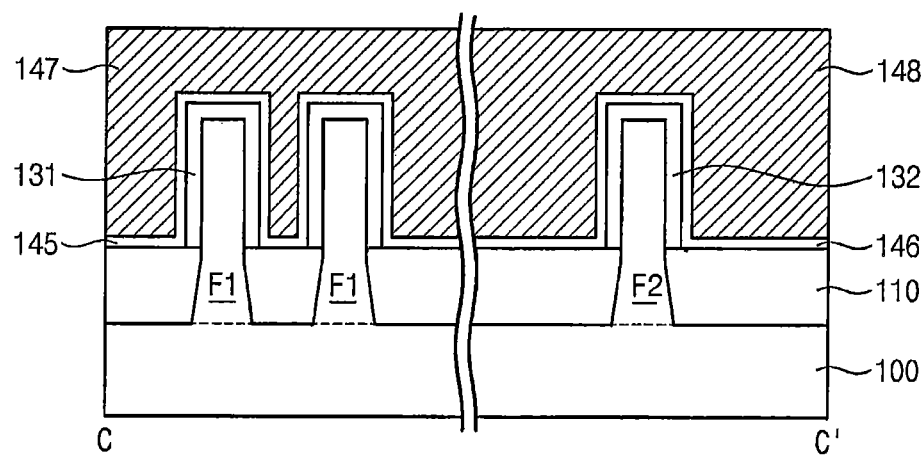

According to embodiments of the inventive concept, one transistor may include one or more fins. As illustrated in FIGS. 11 and 12, a transistor on a first region RG1 may include a plurality of first fins F1 which connect one source region SR and one drain region DR to each other. The inventive concept is not limited to the number of the first fins F1. A transistor on a second region RG2 may include a single second fin F2 connecting one source region SR and one drain region DR to each other. The first region RG1 and the second region RG2 may correspond to two predetermined regions of the substrate 100. First semiconductor layers 131 may be disposed on the plurality of first fins F1 and the second semiconductor layer 132 may be disposed on the second fin F2. In the present embodiment, the first semiconductor layers 131 may not be connected to each other.

FIGS. 13 to 30 are perspective views and cross-sectional views illustrating methods of manufacturing a field effect transistor according to embodiments of the inventive concept.

Figure 13:
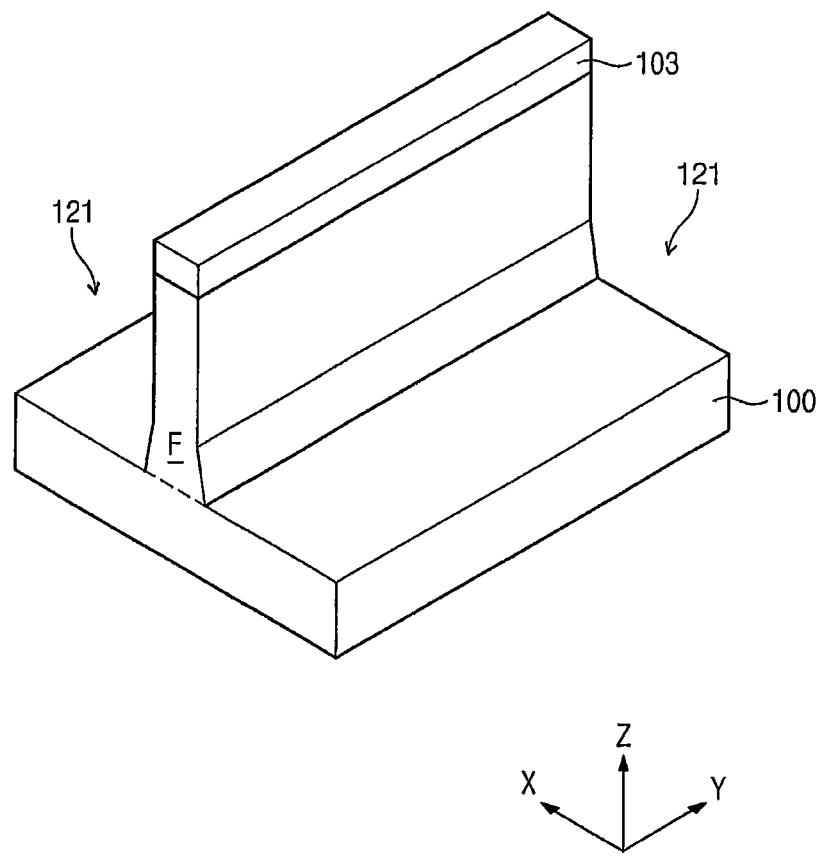
FIGS. 13 to 30 are perspective views and cross-sectional views illustrating methods of manufacturing a field effect transistor according to embodiments of the inventive concept.

Referring to FIG. 13, first trenches 121 for device isolation layers may be formed in a substrate 100. A first mask pattern 103 may be formed on the substrate 100 and then an etching process using the first mask pattern 103 as an etch mask may be performed on the substrate 100 to form the first trenches 121. The first mask pattern 103 may have a linear shape extending in a Y-axis direction. A fin F may be formed to extend in the Y-axis direction by the etching process. The first mask pattern 103 may be formed of at least one of a silicon oxide layer, a silicon nitride layer, and a silicon oxynitride layer.

Figure 14:
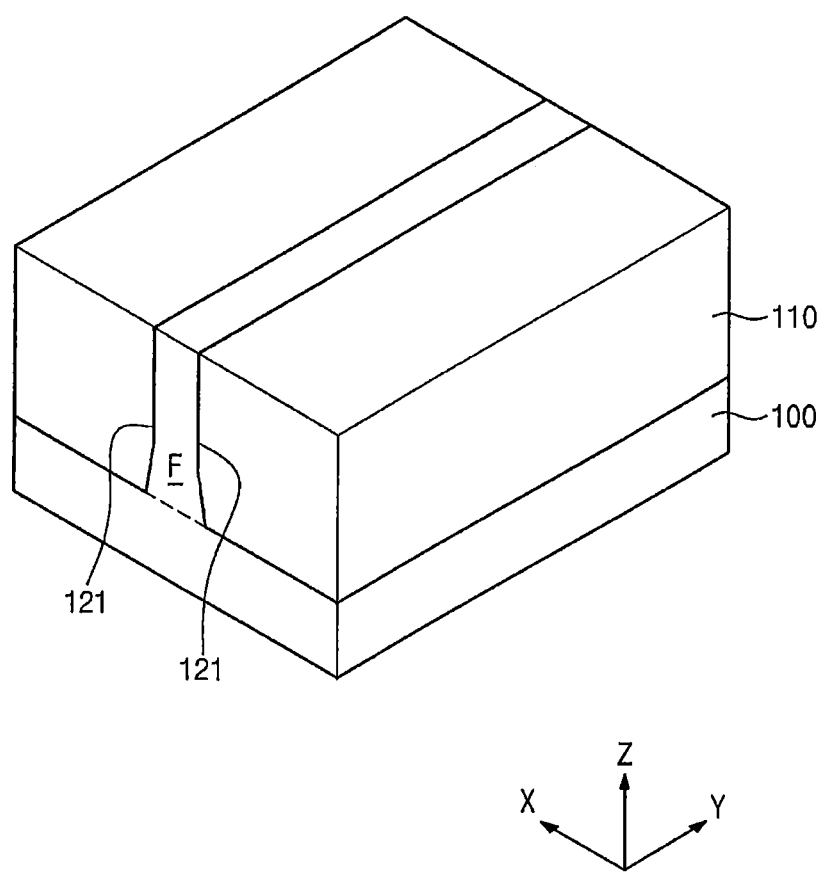
Figure 15:
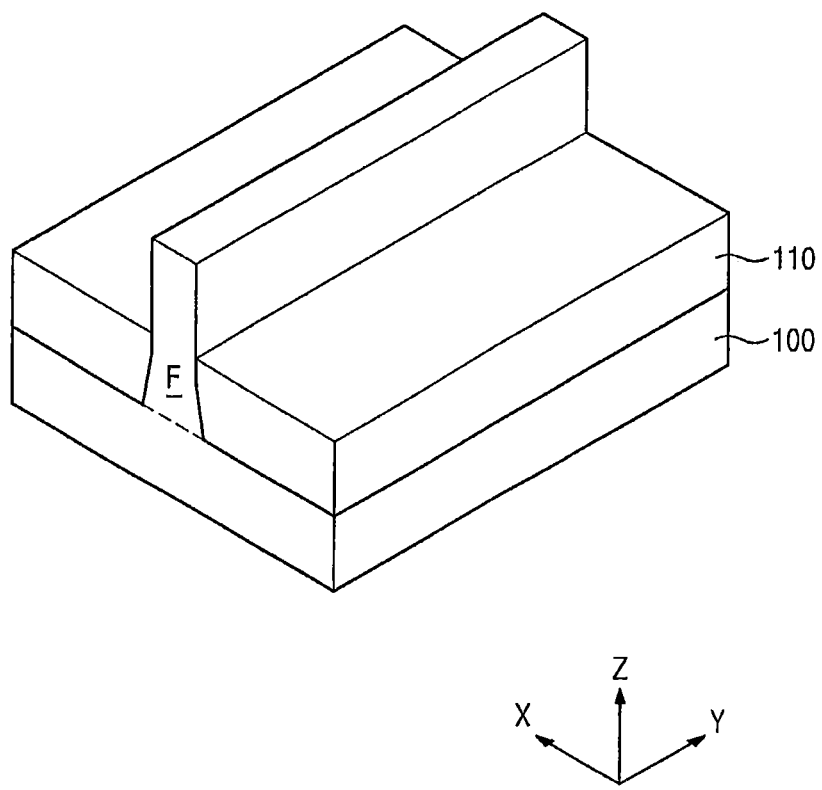

Referring to FIGS. 14 and 15, device isolation layers 110 may be formed to fill the first trenches 121, respectively. The device isolation layers 110 may be formed of at least one of a silicon oxide layer, a silicon nitride layer, a silicon oxynitride layer. Upper portions of the device isolation layers 110 may be recessed to expose an upper portion of the fin F including upper sidewalls thereof. The recess process may include a selective etching process. The first mask pattern 103 may be removed before the formation of the device isolation layers 110 or after the recess process.

In some embodiments according to the inventive concept, the upper portion of the fin F protruding above the device isolation layers 110 may be formed by an epitaxial process. For example, after the device isolation layers 110 are formed, the upper portion of the fin F may be formed by performing the epitaxial process using the exposed top surface of the fin F as a seed without the recess process of the device isolation layers 110. The fin F can include an inner portion.

A doping process for controlling a threshold voltage may be performed on the fin F. If the field effect transistor according to an embodiment is a NMOS transistor, dopants of the doping process may be boron (B). In other embodiments, if the field effect transistor is a PMOS transistor, the dopants of the doping process may be phosphorus (P) or arsenic (As). The doping process for controlling the threshold voltage may be performed in a concentration of about $1 \times 10^{19}$ atoms/cm$^3$. The doping process may be performed as a part of the processes of FIG. 14 or 15. Alternatively, the doping process may be performed before the formation of the first trenches 121 of FIG. 13.

Figure 16:
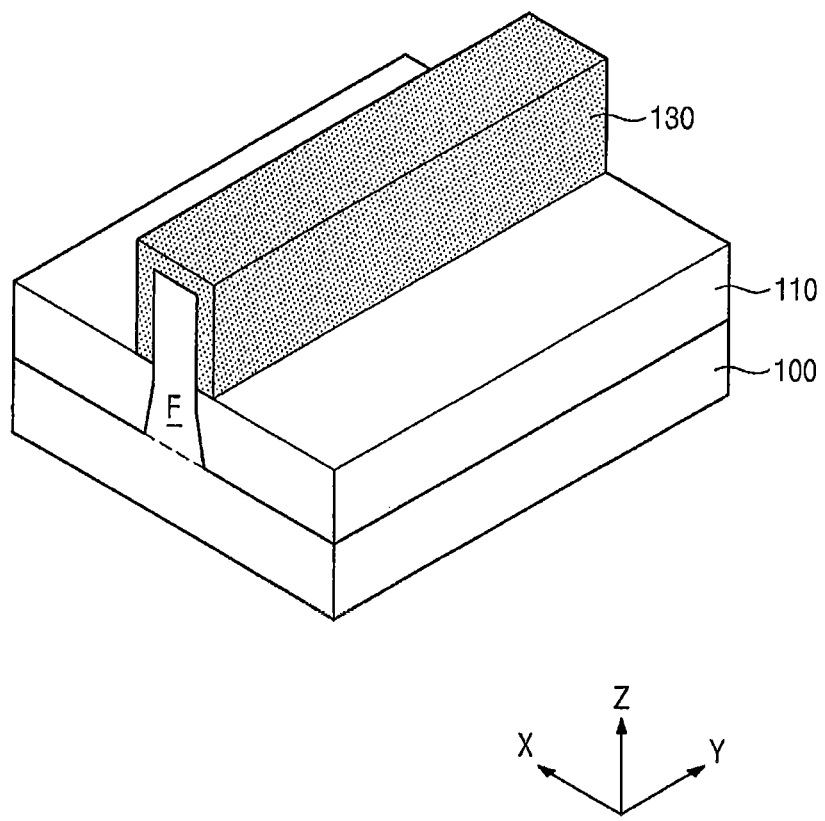

Referring to FIG. 16, a preliminary semiconductor layer 130 may be formed on the fin F which is exposed by the recess process. The preliminary semiconductor layer 130 may have a linear shape extending in the Y-axis direction. The preliminary semiconductor layer 130 may cover a top surface and upper sidewalls of the exposed fin F and be in contact with top surfaces of the device isolation layers 110. In some embodiments, the preliminary semiconductor layer 130 may be formed by an epitaxial process using the fin F as a seed. In other embodiments, the preliminary semiconductor layer 130 may be formed by a process depositing a semiconductor material and a patterning process. Accordingly, the preliminary semiconductor layer 130 can provide the outer portion of the fin F.

The preliminary semiconductor layer 130 may be formed of the same material as the inner portion of the fin F. In some embodiments, the preliminary semiconductor layer 130 may be formed by a homo epitaxial process. Alternatively, the process of forming the preliminary semiconductor layer 130 may include a process depositing the same material as the inner fin F. For example, both the inner fin portion F and the preliminary semiconductor layer 130 may be formed of silicon. Alternatively, the preliminary semiconductor layer 130 may be formed of a material different from the inner fin portion F. For example, if the inner fin portion F is formed of silicon, the preliminary semiconductor layer 130 may be formed of a material including at least one of InSb, InAs, GaSb, InP, GaAs, Ge, SiGe, and SiC. The preliminary semiconductor layer 130 may include a semiconductor material having an energy band gap different from that of the inner fin portion F. For example, the inner fin portion F may be formed of GaAs, and the preliminary semiconductor layer 130 may be formed of AlGaAs.

The preliminary semiconductor layer 130 may have a dopant-concentration lower than that of the inner fin portion F. In some embodiments, initially, the preliminary semiconductor layer 130 may be substantially un-doped, and then the preliminary semiconductor layer 130 may be doped by dopants diffused from the inner fin portion F. In other words, even though initially the preliminary semiconductor layer 130 may be formed not to be substantially doped with dopants, the dopants in the inner fin portion F may be diffused into the preliminary semiconductor layer 130. Thus, a dopant-concentration of the preliminary semiconductor layer 130 may have a profile continuously decreasing from a surface in contact with the inner fin portion F to a surface in contact with the gate dielectric layer 145 of the preliminary semiconductor layer 130. In other embodiments, the preliminary semiconductor layer 130 may be doped with additional dopants in a dopant-concentration equal to or less than about a tenth of that of the inner fin portion F except the dopants diffused from the inner fin portion F.

Figure 17:
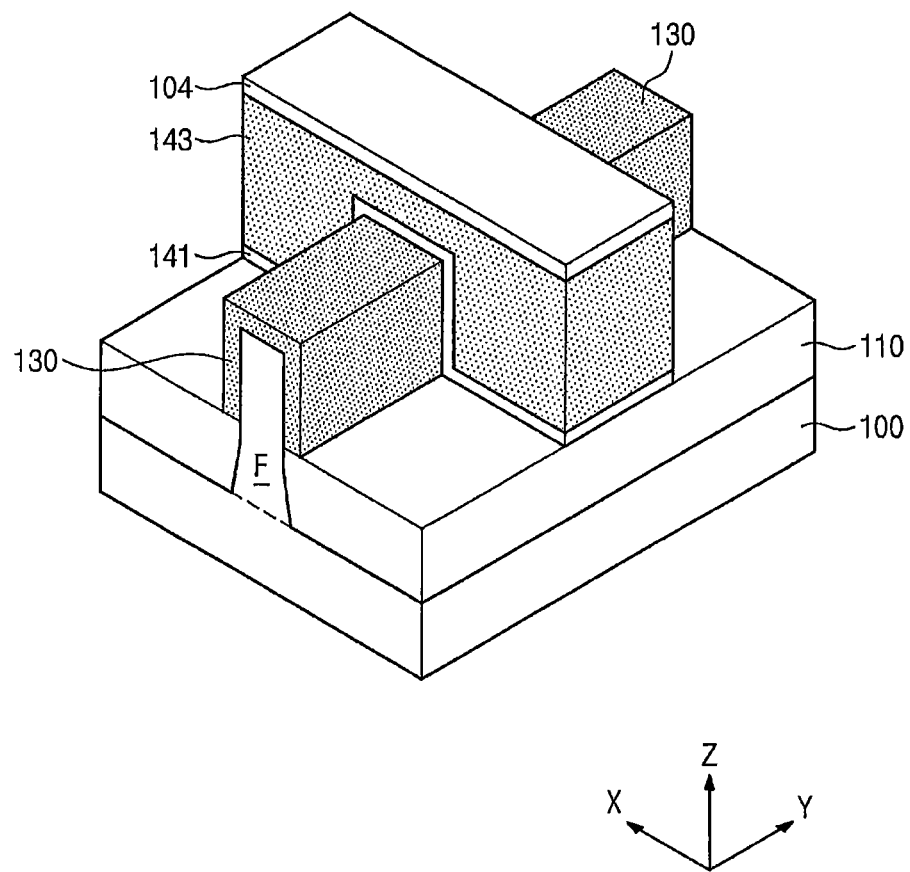

Referring to FIG. 17, a dummy gate dielectric layer 141 and a dummy gate electrode pattern 143 may be formed on the preliminary semiconductor layer 130 (outer fin portion). The dummy gate dielectric layer 141 and the dummy gate electrode pattern 143 may extend in an X-axis direction crossing the fin F. The dummy gate dielectric layer 141 and the dummy gate electrode pattern 143 may extend along a top surface and a sidewall of the preliminary semiconductor layer 130. In some embodiments, after a dielectric layer and a dummy gate electrode material may be formed on the resultant structure on which the preliminary semiconductor layer 130 is formed, an etching process using a second mask pattern 140 as an etch mask may be performed on the dummy gate electrode material and the dielectric layer to form the dummy gate dielectric layer 141 and the dummy gate electrode pattern 143. The etching process may include a plurality of dry and/or wet etching processes. For example, the dummy gate dielectric layer 141 may be formed of a silicon oxide layer. For example, the dummy gate electrode pattern 143 may be formed of poly-silicon.

Figure 18:
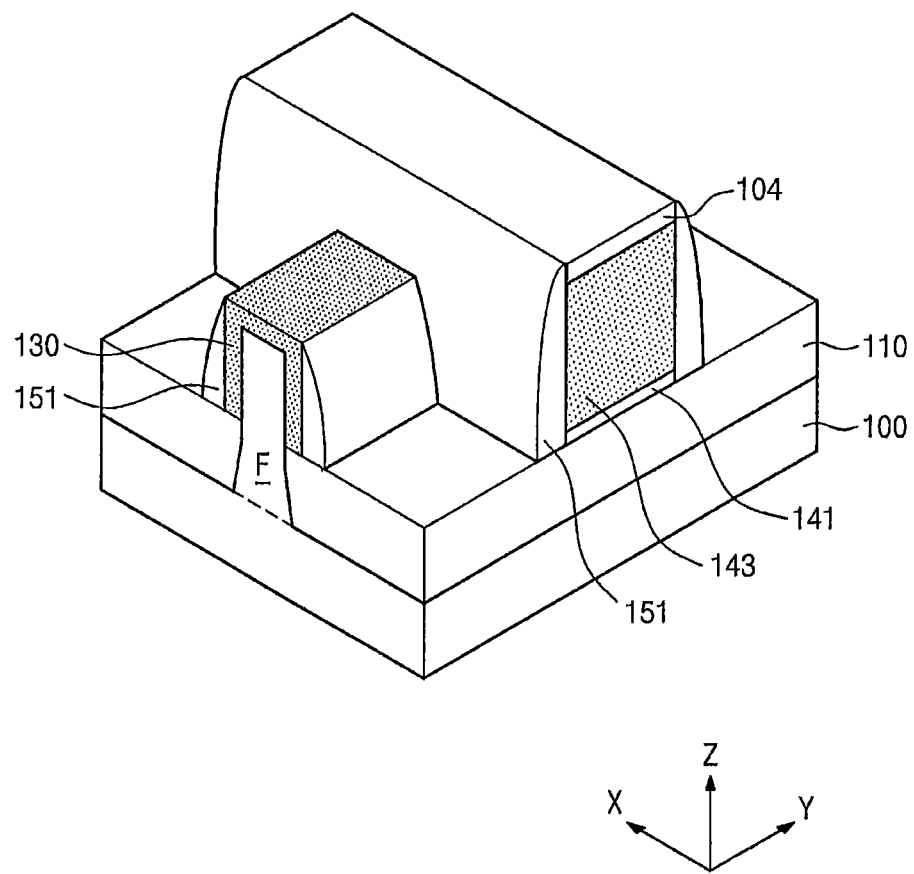

Referring to FIG. 18, spacers 151 may be formed on sidewalls of the dummy gate electrode pattern 143 and the preliminary semiconductor layer 130. In some embodiments, a dielectric layer may be formed on the resultant structure having the dummy gate electrode pattern 143 and then an anisotropic etching process may be performed on the dielectric layer until top surfaces of the preliminary semiconductor layer 130 and the second mask pattern 104 are exposed. Thus, the spacers 151 may be formed. The spacers 151 may be formed of a silicon nitride layer and/or a silicon oxynitride layer.

Figure 19:
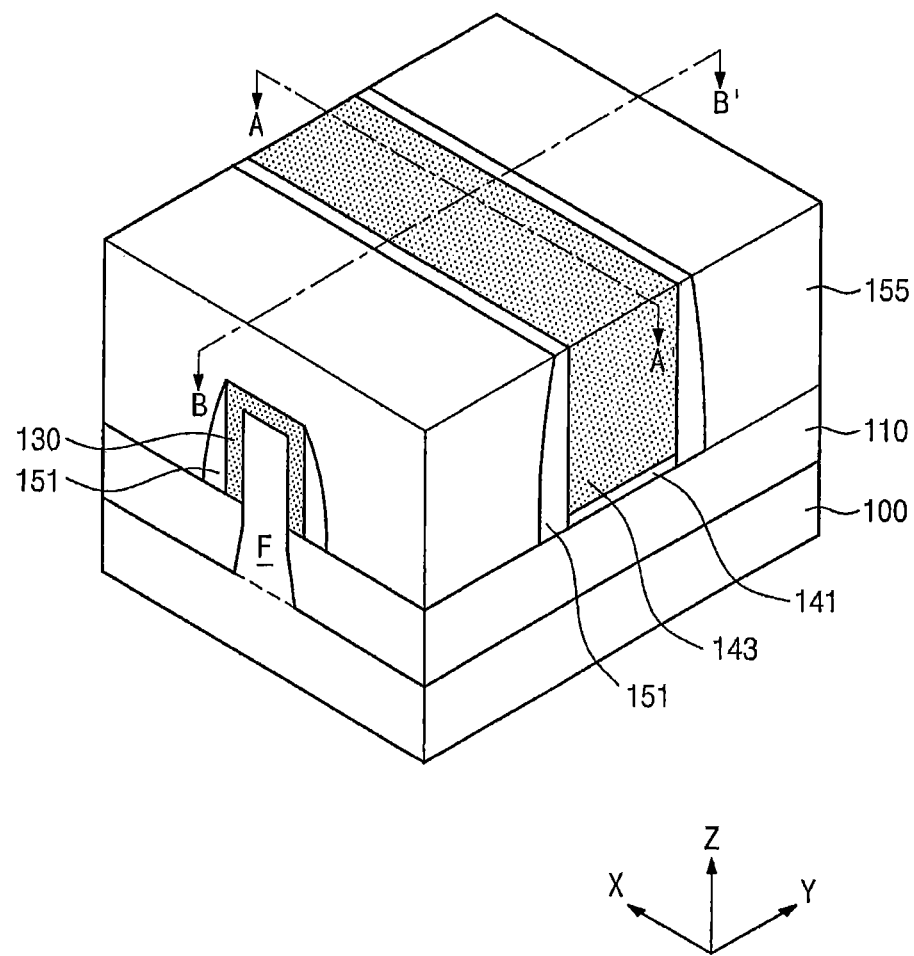
Figure 20:
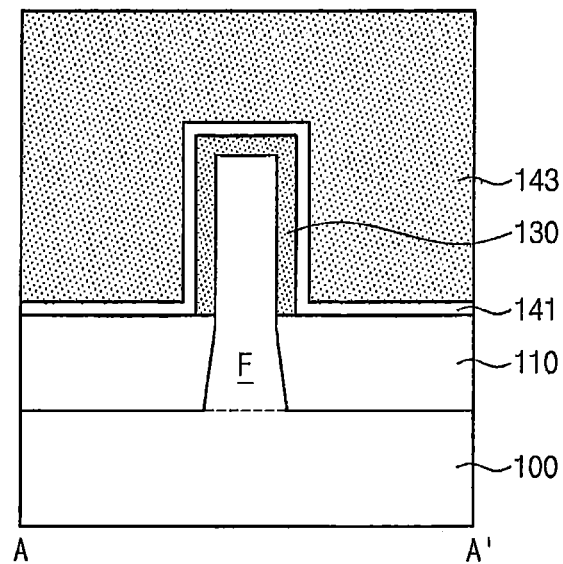
Figure 21:
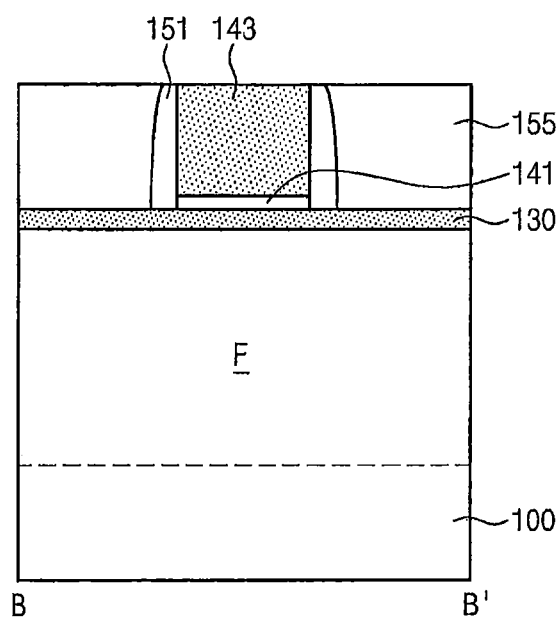

Referring to FIGS. 19 to 21, an interlayer dielectric layer 155 may be formed on the resultant structure on which the spacers 151 are formed. For example, the interlayer dielectric layer 155 may be formed of a silicon oxide layer. FIGS. 20 and 21 are cross-sectional views taken along lines A-A' and B-B' of FIG. 19, respectively. The interlayer dielectric layer 155 may be planarized until a top surface of the dummy gate electrode pattern 143 is exposed. Thus, the second mask pattern 104 may be removed and the top surface of the dummy gate electrode pattern 143 may be exposed.

Figure 22:
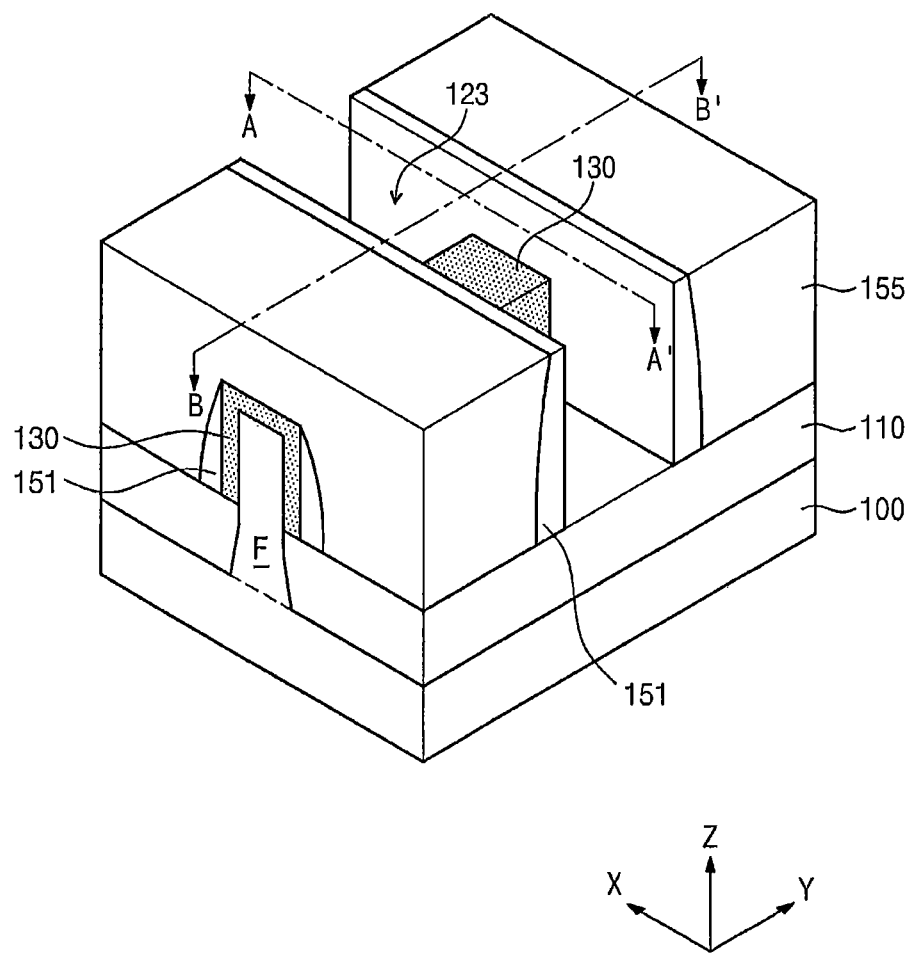
Figure 23:
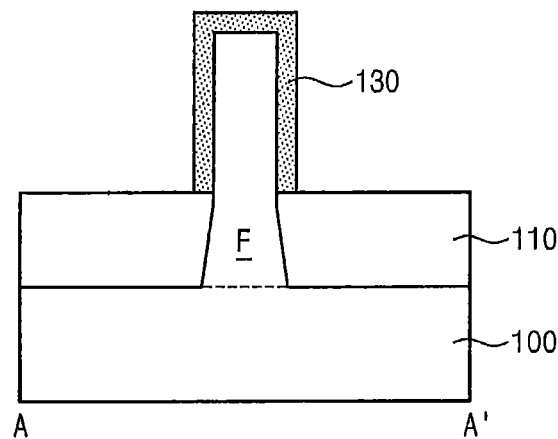
Figure 24:
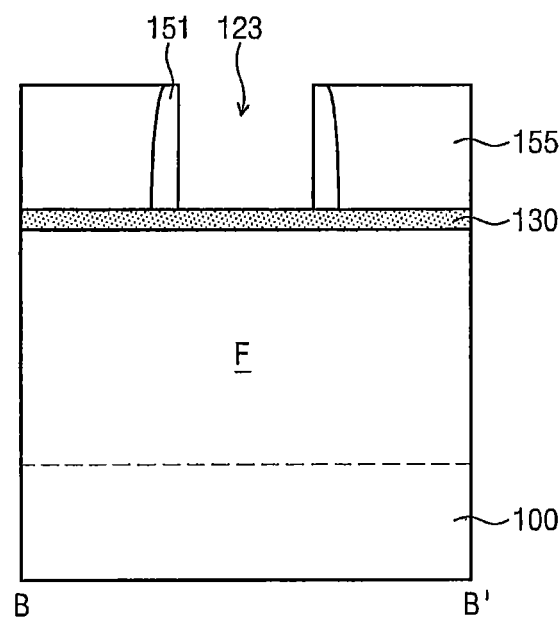

Referring to FIGS. 22 to 24, the dummy gate electrode pattern 143 and the dummy gate dielectric layer 141 may be removed. FIGS. 23 and 24 are cross-sectional views taken along lines A-A' and B-B' of FIG. 22, respectively. A second trench 123 exposing the preliminary semiconductor layer 130 may be formed by removing the dummy gate electrode pattern 143 and the dummy gate dielectric layer 141. Removing the dummy gate electrode pattern 143 and the dummy gate dielectric layer 141 may be performed by a plurality of selective etching processes.

Figure 25:
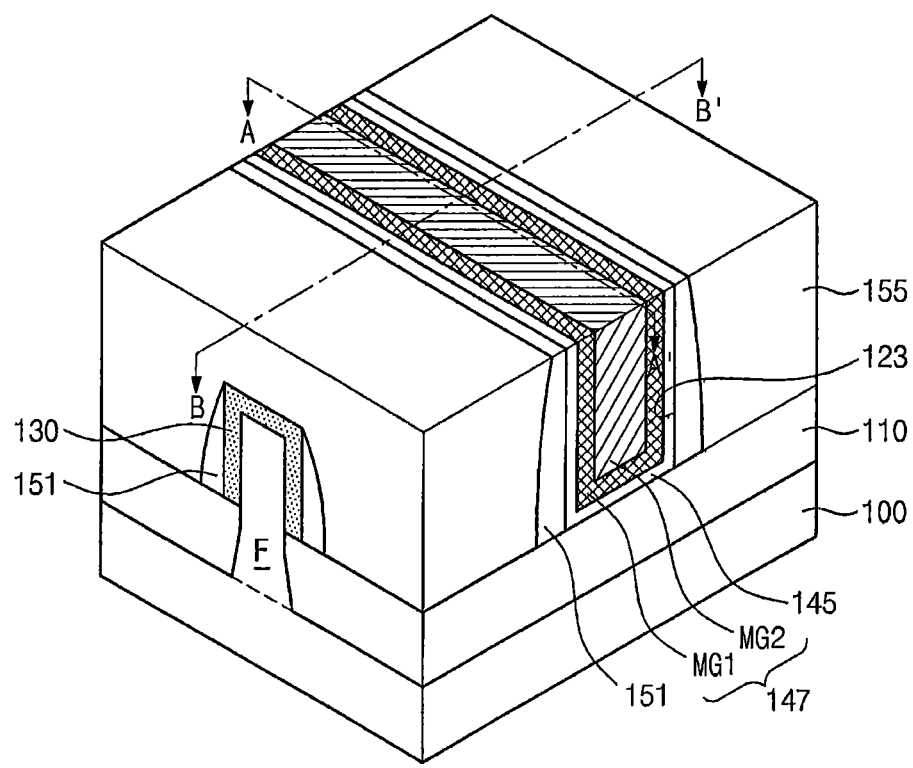
Figure 26:
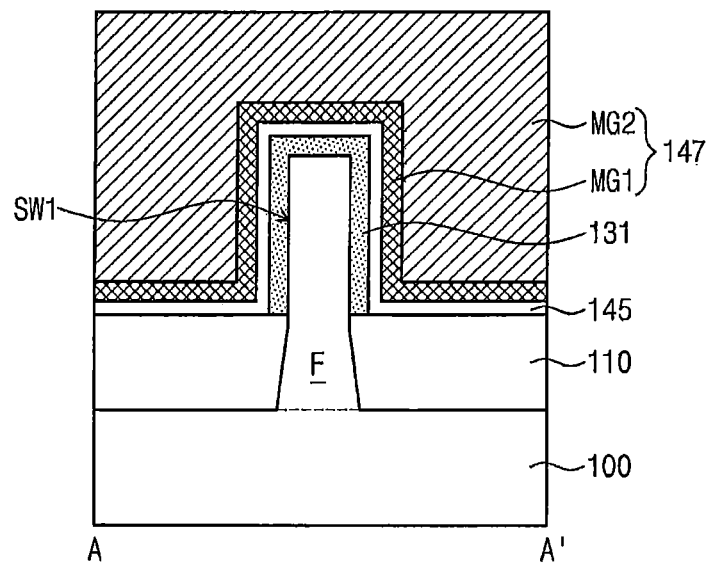
Figure 27:
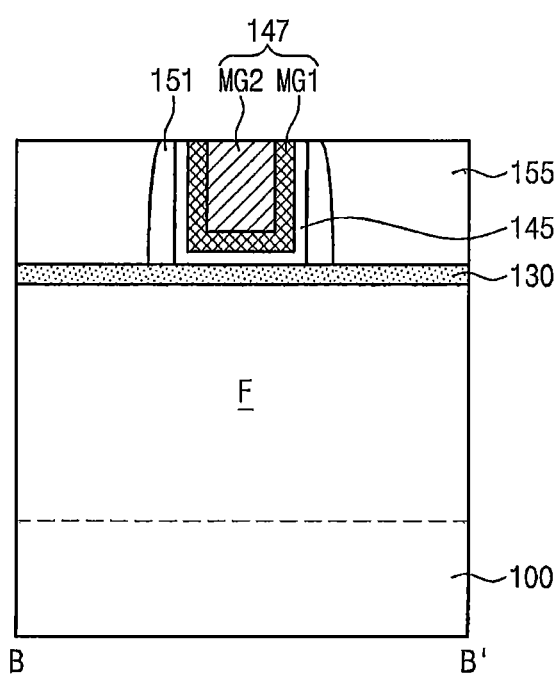

Referring to FIGS. 25 to 27, a gate dielectric layer 145 and a gate electrode pattern 147 may be sequentially formed in the second trench 123. FIGS. 26 and 27 are cross-sectional views taken along lines A-A' and B-B' of FIG. 25, respectively. For example, the gate dielectric layer 145 may include a high-k dielectric material having a dielectric constant greater than that of a silicon oxide layer. For example, the gate dielectric layer 145 may include $HfO_2$, $ZrO_2$ and/or $Ta_2O_5$. The gate dielectric layer 145 may be conformally formed along sidewalls and a bottom surface of the second trench 123. The gate electrode pattern 147 may include at least one metal layer. For example, the gate electrode pattern 147 may include a first sub-gate electrode MG1 and a second sub-gate electrode MG2. The first sub-gate electrode MG1 may be conformally formed along the gate dielectric layer 145, and the second sub-gate electrode MG2 may be disposed on the first sub-gate electrode MG1 and fill the remaining region of the second trench 123. For example, the first sub-gate electrode MG1 may include at least one of TiN, TaN, TiC, and TaC. Also the second sub-gate electrode MG2 may include tungsten or aluminum. The gate electrode pattern 147 may be formed by a damascene process using the interlayer dielectric layer 155 and the spacer 151 as a mold.

Figure 28:
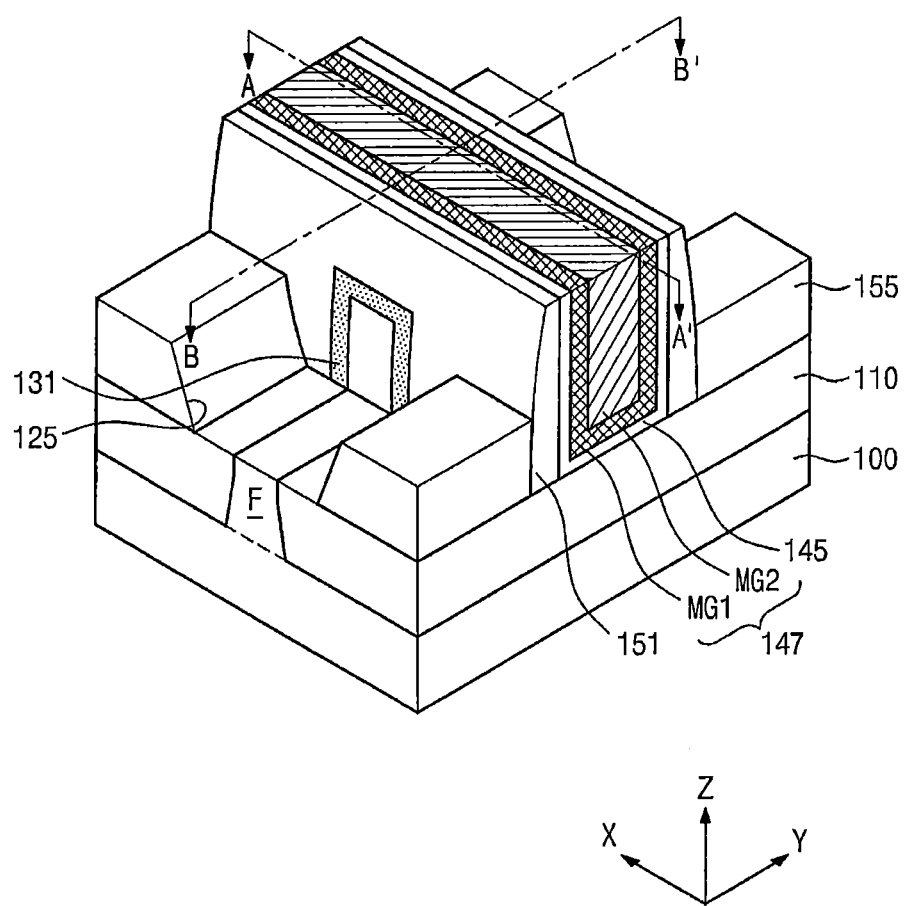
Figure 29:
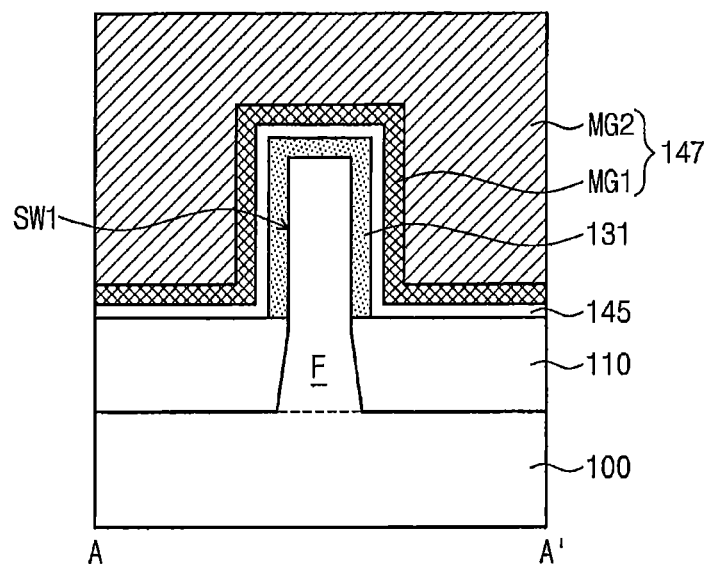
Figure 30:
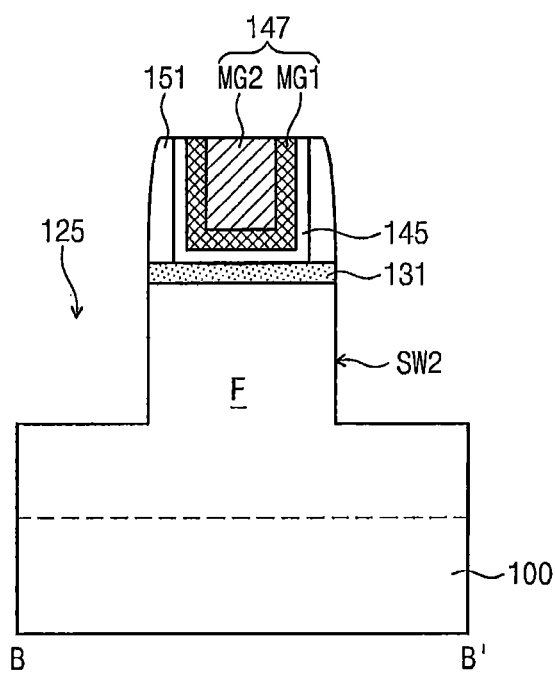

Referring to FIGS. 28 to 30, recess regions 125 may be formed at both sides of the gate electrode pattern 147, respectively. Forming the recess regions 125 may include patterning the interlayer dielectric layer 155, the preliminary semiconductor layer 130, and an upper portion of the fin F. Forming the recess regions 125 may include a plurality of etching processes. In some embodiments, an upper portion of the interlayer dielectric layer 155 may be selectively removed to expose the preliminary semiconductor layer 130 at both sides of the gate electrode pattern 147. And then the preliminary semiconductor layer 130 and the fin F may be etched to form the recess regions 125. In some embodiments, the spacers 151 may be formed of a material having an etch selectivity with respect to the interlayer dielectric layer 155, so that the spacers 151 may protect the gate electrode pattern 147 during the etching of the interlayer dielectric layer 155. After etching the preliminary semiconductor 130, the spacers 151 on the sidewalls of the preliminary semiconductor layer 130 may be removed with the interlayer dielectric layer 155 adjacent thereto. A portion of the spacers 151 on the sidewall of the preliminary semiconductor layer 130 may remain. The recess regions 125 are formed, so that a semiconductor layer 131 may remain in a crossing region of the gate electrode pattern 147 and the fin F. The semiconductor layer 131 may correspond to a portion of the preliminary semiconductor layer 130. Additionally, when the recess regions 125 are formed, the upper portion of the fin F at both sides of the gate electrode pattern 147 may be etched to form second sidewalls SW2 of the fin F. The recess regions 125 may expose sidewalls of the semiconductor layer 131 and the second sidewalls SW2 of the fin F.

Referring to FIGS. 1 to 3 again, source/drain regions 161 may be formed in the recess regions 125, respectively. The source/drain regions 161 may be in contact with the sidewalls of the semiconductor layer 131 and the second sidewalls SW2 of the fin F which are exposed by the recess regions 125. In some embodiments, the source/drain regions 161 may be formed to have elevated source/drain shapes having top surfaces higher than a top surface of the semiconductor layer 131. The source/drain regions 161 may be insulated from the gate electrode pattern 147 by the spacers 151.

If the field effect transistor is a PMOS transistor, the source/drain regions 161 may be compressive stress patterns. The compressive stress patterns may apply a compressive stress to the outer fin semiconductor layer 131 and the inner fin portion F, such that the mobility of carriers in the channel region may be improved. For example, the compressive stress patterns may include a material (e.g., silicon-germanium (SiGe)) having a lattice constant greater than that of silicon. Alternatively, if the field effect transistor is an NMOS transistor, the source/drain regions 161 may be formed of the same material as the substrate 100. For example, if the substrate 100 is a silicon substrate, the source/drain regions 161 may be formed of poly-silicon.

Figure 31:
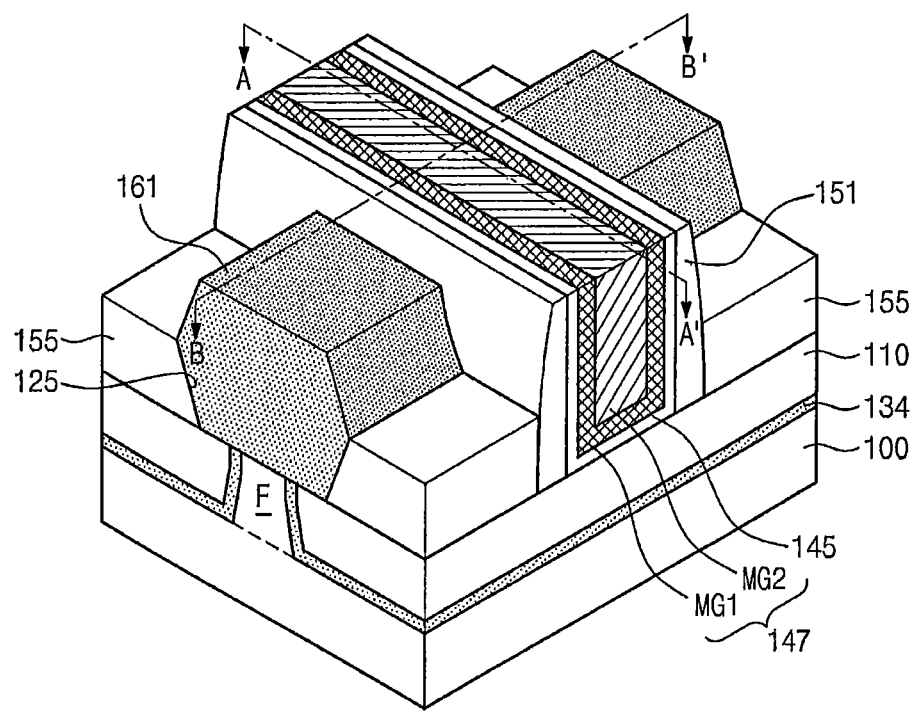
FIG. 31 is a perspective view illustrating a field effect transistor according to another embodiment of the inventive concept.
Figure 32:
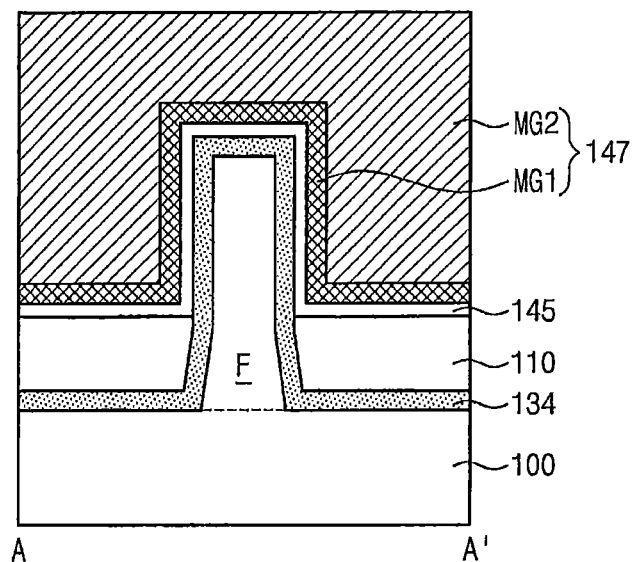
FIGS. 32 and 33 are cross-sectional views taken along a line A-A' and a line B-B' of FIG. 31.
Figure 33:
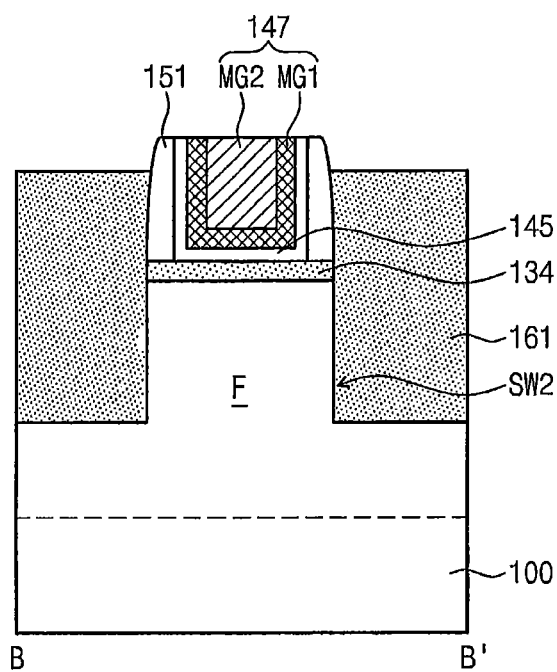
Figure 34:
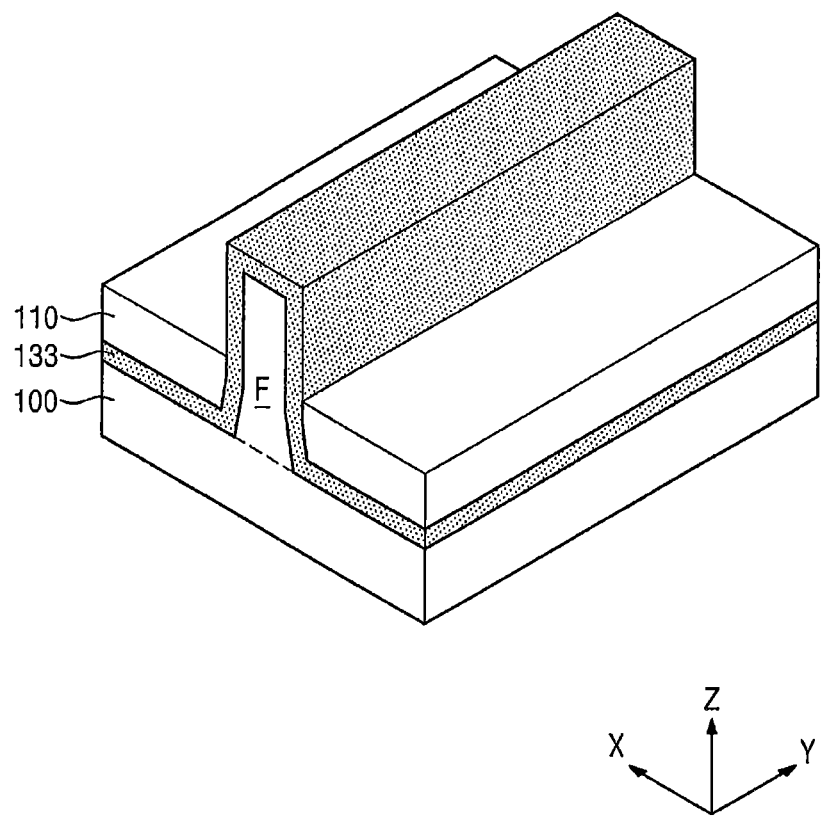
FIG. 34 is a perspective view illustrating methods of forming a semiconductor layer according to other embodiments of the inventive concept.

FIG. 31 is a perspective view illustrating a field effect transistor according to another embodiment of the inventive concept. FIGS. 32 and 33 are cross-sectional views taken along a line A-A' and a line B-B' of FIG. 31. FIG. 34 is a perspective view illustrating a method of forming a semiconductor layer according to another embodiment of the inventive concept.

A field effect transistor according to another embodiment of the inventive concept and methods of manufacturing the same are described with respect to FIGS. 31 to 34. In the present embodiment, a semiconductor layer 134 may further extend between the substrate 100 and the device isolation layers 110. As illustrated in FIG. 34, the semiconductor layer 134 may be formed before the formation of the device isolation layers 110. For example, after the substrate 100 is etched to form a fin F, an epitaxial process may be performed on the substrate 100 having the fin F, thereby forming a preliminary semiconductor layer 133 (as the outer fin). Device isolation layers 110 may be formed to fill first trenches on the preliminary semiconductor layer 133. Subsequently, the processes described with reference to FIGS. 16 to 30 may be performed to the field effect transistor illustrated in FIGS. 31 to 33. In more detail, the preliminary semiconductor layer 133 may be partially etched during the formation of the recess regions 125 described with reference to FIGS. 28 to 30, thereby forming the semiconductor layer 134.

Figure 35:
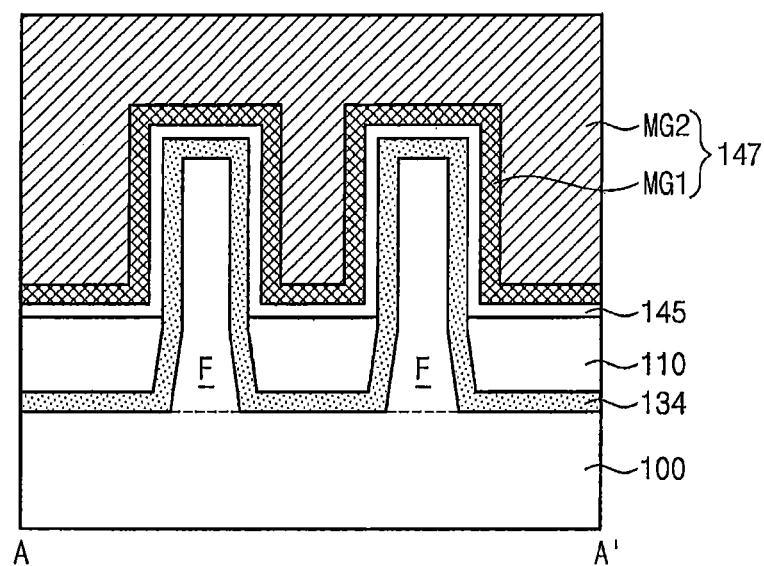
FIG. 35 is a cross-sectional view illustrating a field effect transistor according to still another embodiment of the inventive concept.

FIG. 35 is a cross-sectional view illustrating a field effect transistor according to still another embodiment of the inventive concept. In the present embodiment, the field effect transistor illustrated in FIG. 31 may be modified to include a plurality of fins F as described in FIGS. 11 and 12. In the present embodiment, the semiconductor layer 134 may further extend between the substrate 100 and the device isolation layers 110 around the plurality of fins F, differently from FIG. 12. Thus, the semiconductor layer 134 may connect the plurality of fins F to each other. The plurality of fins F may be included in one transistor and connect one source region to one drain region.

Figure 36:
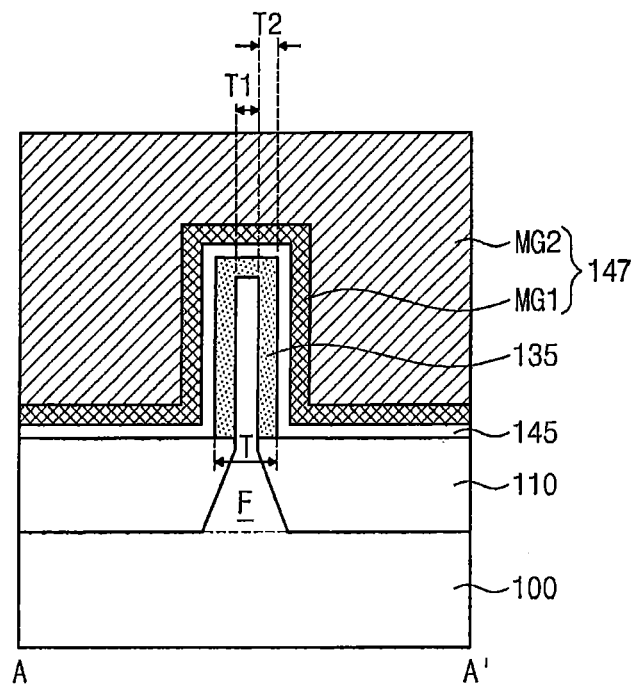
FIGS. 36 and 37 are cross-sectional views illustrating a field effect transistor according to yet another embodiment of the inventive concept.
Figure 37:
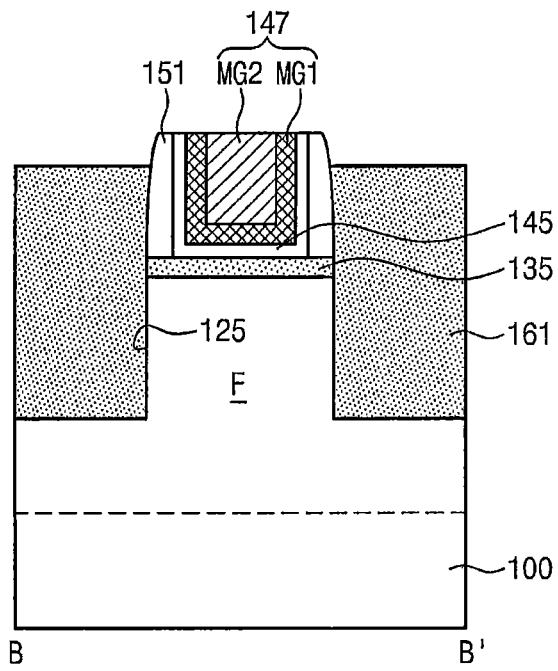
Figure 38:
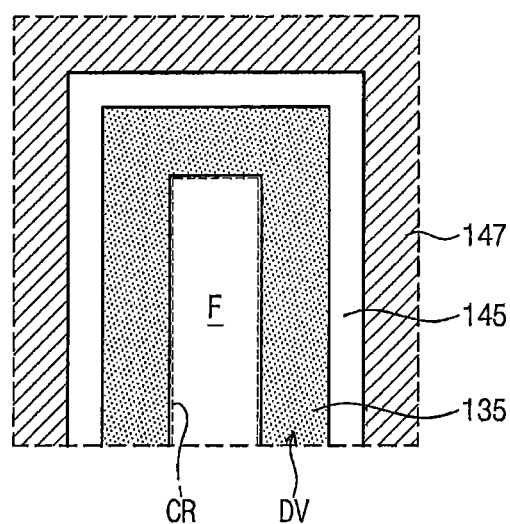
FIG. 38 is an enlarged view of a fin portion and a region adjacent to the fin portion of FIG. 36.

FIGS. 36 and 37 are cross-sectional views illustrating a field effect transistor according to yet another embodiment of the inventive concept. FIGS. 36 and 37 are cross-sectional views taken along a line A-A' and a line B-B' of FIG. 1. FIG. 38 is an enlarged view of a fin and a region adjacent to the fin of FIG. 36.

In the present embodiment, a thickness T1 of fins F may be less than those of the fins F of the embodiments mentioned above. A total thickness T of semiconductor materials surrounded by the gate electrode pattern 147 may be represented by the following formula:

$$T = T1 + 2 \times T2,$$

where T1 is the thickness of the inner fin F, and T2 is a thickness of the outer fin portion of a semiconductor layer 135.

For example, the total thickness T may be less than about 10 nm. In other embodiments, the thickness T1 of the inner fin portion F may be less than twice the thickness T2 of the outer fin portion (semiconductor layer 135).

If the thickness T1 of the inner fin portion F is very thin, movement of carriers may be spatially limited, and overlap of wave functions showing existence probability of particles may occur in the inner fin portion F. Since the square of an absolute value of the wave function may represent the existence probability of the carrier, an inversion region may be formed not in the semiconductor layer 135 but in the inner fin portion F. The inversion region in the inner fin portion F is referred to as 'a volume inversion'. Thus, the inner fin portion F may be used as a channel CR in the present embodiment as illustrated in FIG. 38. Although some dimensions of total fin width are disclosed herein where volume inversion may occur in some embodiments according to the inventive concept, it will be understood that in some embodiments according to the inventive concept, a thickness is described as an approximate dimension where volume inversion may occur in the device. For example, in some embodiments according to the inventive concept, the total width of the fin (including the threshold voltage control region and the carrier region) is described as being greater than about an amount where volume inversion occurs in the fin, so that the threshold voltage control region would then be the inner portion of the fin and the carrier region would be the outer portion of the fin that is grown on the inner portion.

In the present embodiment, the outer fin portion (semiconductor layer 135) may include a threshold voltage control doped region DV. The threshold voltage control doped region DV and the inner fin portion F may be doped with dopants of the same conductivity type. For example, if the field effect transistor is an NMOS transistor, the dopant may be boron (B). Alternatively, if the field effect transistor is a PMOS transistor, the dopant may be phosphorus (P) or arsenic (As).

In the present embodiment, the inner fin portion F may have a dopant-concentration less than that of the threshold voltage control doped region DV. For example, the inner fin portion F may be in a substantially un-doped state except those dopants that are diffused from the outer fin portions (semiconductor layer 135). Even though initially the inner fin portion F may not be substantially doped, the dopant-concentration of the inner fin portion F may have a profile continuously decreasing from a surface of the fin portion F in contact with the outer fin portion (semiconductor layer 135) to the inside of the inner fin portion F.

In other embodiments, the inner fin portion F may be initially doped to have a dopant-concentration equal to or less than about a tenth of the dopant-concentration of the threshold voltage control doped region DV.

When the field effect transistor operates, the channel CR is formed in the inner fin portion F as illustrated in FIG. 38. When the inner fin portion F having the relatively low dopant-concentration is used as a channel region of a transistor, an electric field applied to the channel region by the gate electrode pattern 147 is reduced. Mobility of carriers may increase by the reduction of the electric field. Semiconductor materials of the outer fin portion (semiconductor layer 135) and the inner fin portion F may be the same as those of the semiconductor layer 131 and the inner fin portion F described with reference to FIGS. 1 to 4, respectively.

The doping of the semiconductor layer 135 may be performed in situ. In some embodiments, the semiconductor layer 135 may be formed by an epitaxial process using the inner fin portion F as a seed, and the threshold voltage control doped region DV may be formed simultaneously with performing the epitaxial process.

Figure 39:
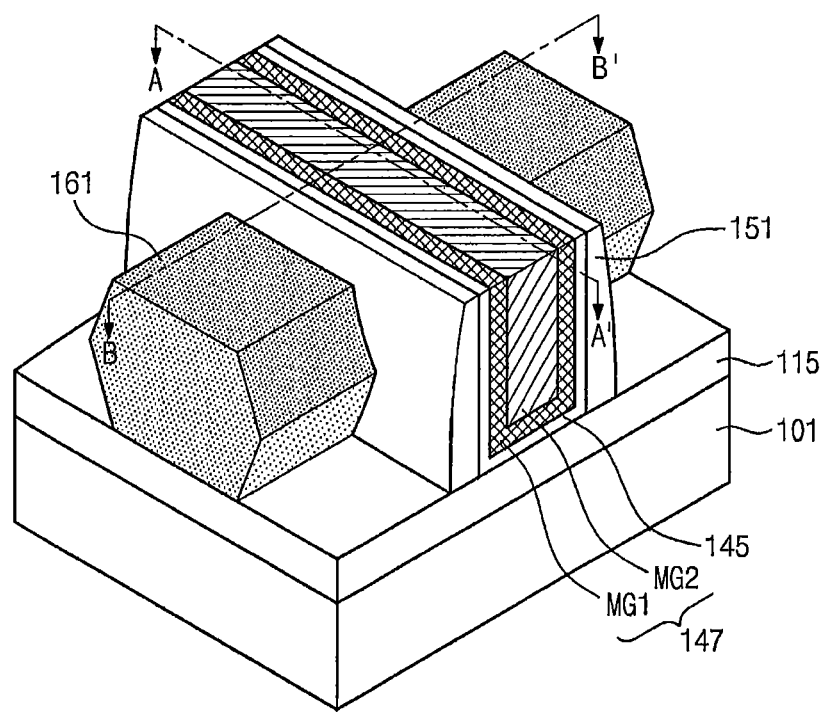
FIG. 39 is a perspective view illustrating a field effect transistor according to yet still another embodiment of the inventive concept.
Figure 40:
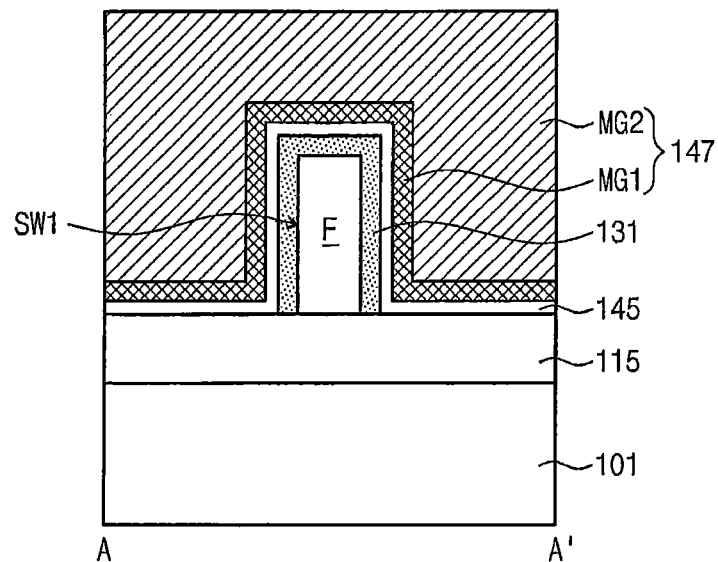
FIGS. 40 and 41 are cross-sectional views taken along a line A-A' and a line B-B' of FIG. 39.
Figure 41:
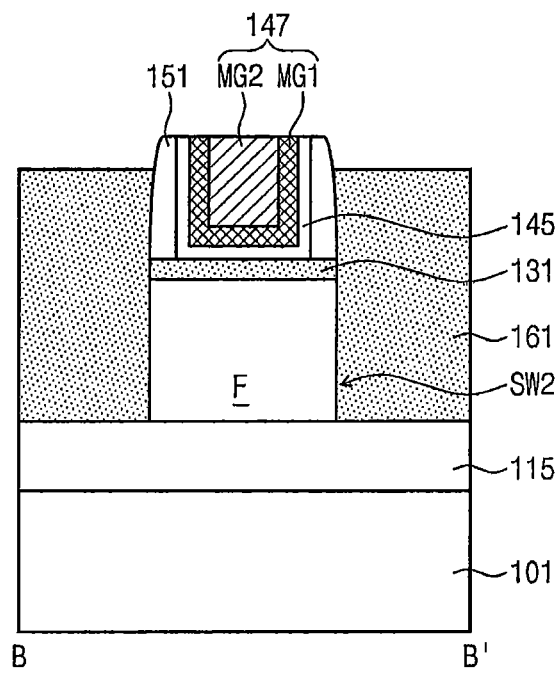

FIGS. 39 to 41 are views illustrating a field effect transistor according to yet still another embodiment of the inventive concept. FIG. 39 is a perspective view illustrating a field effect transistor according to yet still another embodiment of the inventive concept, and FIGS. 40 and 41 are cross-sectional views taken along a line A-A' and a line B-B' of FIG. 39. For the purpose of ease and convenience in explanation, the descriptions of previously described elements may be omitted.

In the present embodiment, the field effect transistor may be formed on a silicon-on-insulator (SOI) substrate. The SOI substrate may include a first layer 101, a second layer 115, and a third layer. The first layer 101 and the third layer may be formed of a semiconductor material, and the second layer 115 may be a dielectric layer such as a silicon oxide layer. The third layer may be patterned to form a fin F. Thus, the fin F may be insulated from the first layer 101 by the second layer 115. Other elements in the present embodiment may be the same as corresponding elements described in the above embodiments, thus the descriptions thereof may be omitted.

Figure 42:
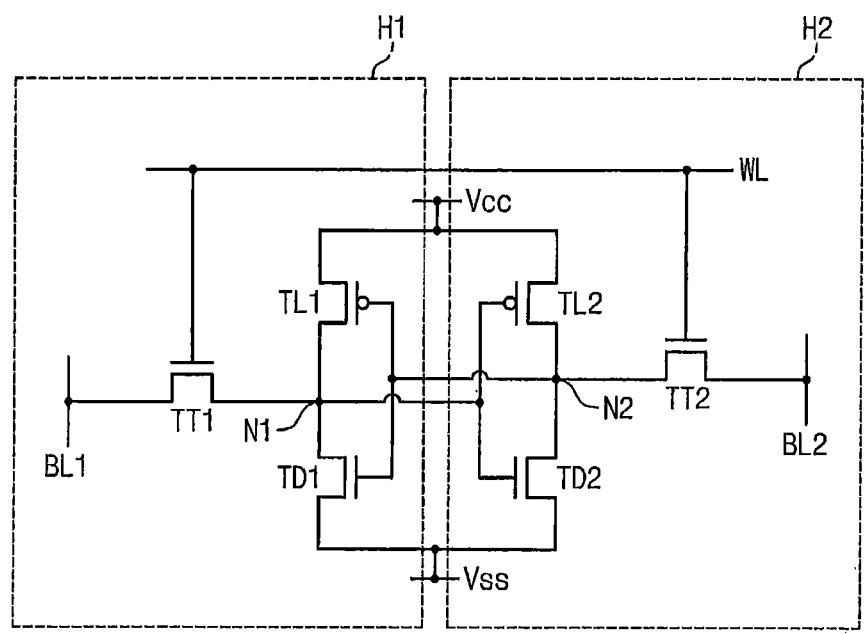
FIG. 42 is a circuit diagram of a complementary metal-oxide-semiconductor (CMOS) static random access memory (SRAM) cell including at least one of the field effect transistors according to embodiments of the inventive concept.

FIG. 42 is a circuit diagram of a complementary metal-oxide-semiconductor (CMOS) static random access memory (SRAM) cell including at least one of the field effect transistors according to embodiments of the inventive concept. Referring to FIG. 42, the CMOS SRAM cell may include a pair of driver transistors TD1 and TD2, a pair of transfer transistors TT1 and TT2, and a pair of load transistors TL1 and TL2. The driver transistors TD1 and TD2 may correspond to pull-down transistors, the transfer transistors TT1 and TT2 may correspond to pass transistors, and the load transistors TL1 and TL2 may correspond to pull-up transistors. The driver transistors TD1 and TD2 and the transfer transistors TT1 and TT2 may be NMOS transistors, and the load transistors TL1 and TL2 may be PMOS transistors.

A first driver transistor TD1 and a first transfer transistor TT1 may be connected in series to each other. A source region of the first driver transistor TD1 may be electrically connected to a ground line Vss, and a drain region of the first transfer transistor TT1 may be electrically connected to a first bit line BL1. A second driver transistor TD2 and a second transfer transistor TT2 may be connected in series to each other. A source region of the second driver transistor TD2 may be electrically connected to the ground line Vss, and a drain region of the second transfer transistor TT2 may be electrically connected to a second bit line BL1.

A source region and a drain region of a first load transistor TL1 may be electrically connected to a power line Vcc and a drain region of the first driver transistor TD1, respectively. A source region and a drain region of a second load transistor TL2 may be electrically connected to the power line Vcc and a drain region of the second driver transistor TD2, respectively. The drain region of the first load transistor TL1, the drain region of the first driver transistor TD1, and the source region of the first transfer transistor TT1 may correspond to a first node N1. The drain region of the second load transistor TL2, the drain region of the second driver transistor TD2, and the source region of the second transfer transistor TT2 may correspond to a second node N2. Gate electrodes of the first driver transistor TD1 and the first load transistor TL1 may be electrically connected to the second node N2, and gate electrodes of the second driver transistor TD2 and the second load transistor TL2 may be electrically connected to the first node N1. Gate electrodes of the first and second transfer transistors TT1 and TT2 may be electrically connected to a word line WL. The first driver transistor TD1, the first transfer transistor TT1, and the first load transistor TL1 may constitute a first half cell H1, and the second driver transistor TD2, the second transfer transistor TT2, and the second load transistor TL2 may constitute a second half cell H2.

The field effect transistors described in the above embodiments may be applied to at least one of the driver transistors TD1 and TD2, the transfer transistors TT1 and TT2, and the load transistors TL1 and TL2. If the field effect transistors described in the above embodiments may be applied to at least two of the transistors TD1, TD2, TT1, TT2, TL1, and TL2, a width, a height, and the number of the fin applied to each transistor and a providing region of the semiconductor layer may be variously changed in the spirit and scope of the inventive concept. The inventive concept is not limited to the SRAM cell. In other embodiments, the inventive concept may be applied to a dynamic random access memory (DRAM) device, a magnetic random access memory (MRAM) device, and/or other semiconductor devices and methods of manufacturing the same.

Figure 43:
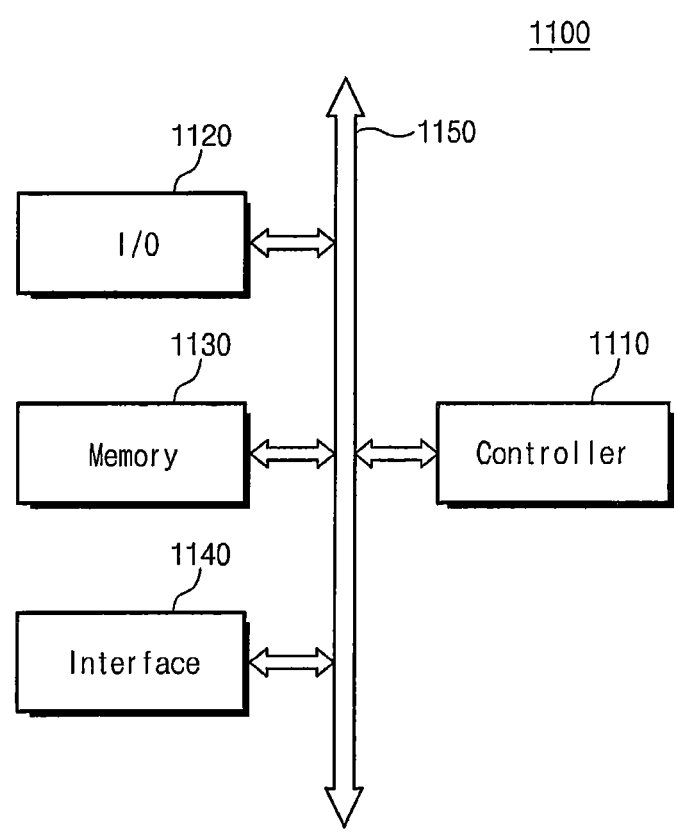
FIG. 43 is a block diagram illustrating an example of electronic systems including field effect transistors according to embodiments of the inventive concept.

FIG. 43 is a block diagram illustrating an example of electronic systems including field effect transistors according to embodiments of the inventive concept.

Referring to FIG. 43, an electronic system 1100 according to embodiments of the inventive concept may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller or other logic devices. The other logic devices may have a similar function to any one of the microprocessor, the digital signal processor and the microcontroller. The I/O unit 1120 may include a keypad, a keyboard and/or a display unit. The memory device 1130 may store data and/or commands. The interface unit 1140 may operate wirelessly or by cable. For example, the interface unit 1140 may include an antenna for wireless communication or a transceiver for cable communication. The electronic system 1100 may further include a fast DRAM device and/or a fast SRAM device which acts as a cache memory for improving an operation of the controller 1110. The field effect transistor according to embodiments of the inventive concept may be provided in any portion of the electronic system 1100.

The electronic system 1100 may be applied to a personal digital assistant (PDA), a portable computer, a web tablet, a wireless phone, a mobile phone, a digital music player, a memory card or other electronic products. The other electronic products may receive or transmit information/data wirelessly.

According to embodiments of the inventive concept, the field effect transistor may improve a mobility characteristic.

According to embodiments of the inventive concept, the field effect transistor may improve distribution of the threshold voltage.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A Field Effect Transistor (FET) structure, comprising:
   a substrate;
   a device isolation layer on the substrate;
   a fin structure protruding upward from the substrate through the device isolation layer, the fin structure being doped with a first concentration of impurities; and
   a semiconductor layer between a surface of the substrate and a lower surface of the device isolation layer that faces the surface of the substrate, the semiconductor layer extending between the device isolation layer and the fin structure to cover a sidewall of the fin structure, the semiconductor layer being doped with a second concentration of impurities that is different from the first concentration of impurities wherein the semiconductor layer is an epitaxial layer grown from the fin structure and the substrate.

2. The structure of claim 1, wherein the second concentration of impurities is less than the first concentration of impurities, wherein the fin structure comprises a threshold voltage control region of the FET structure and the semiconductor layer comprises a carrier region of the FET structure.

3. The structure of claim 1, wherein a total width of the fin structure and the semiconductor layer is less than about 10 nm.

4. The structure of claim 3, wherein the first concentration of impurities is less than the second concentration of impurities, wherein the fin structure comprises a carrier region of the FET structure and the semiconductor layer comprises a threshold voltage control region of the FET structure.

5. The structure of claim 1, wherein an upper surface of the device isolation layer has a level lower than an upper surface of the fin structure.

6. The structure of claim 1, wherein the second concentration of impurities is less than the first concentration of impurities, wherein the second concentration of impurities comprises diffused impurities from the first concentration of impurities.

7. The structure of claim 6, wherein the second concentration of impurities comprises about 10 percent or less of the first concentration of impurities.

8. The structure of claim 1, further comprising:
   a gate dielectric on upper surfaces of the semiconductor layer and the device isolation layer; and
   a gate electrode on the gate dielectric.

9. The structure of claim 1, wherein the fin structure including the semiconductor layer thereon comprises a gate-all-around structure.

10. The structure of claim 9, wherein the gate-all-around structure comprises a nanowire structure comprising a total width less than about 10 nm.

11. The structure of claim 1, wherein each of sidewalls of the fin structure has two different slopes; and wherein the FET structure further comprises a finFET gate structure crossing over the fin structure and the semiconductor layer.

12. The structure of claim 11, wherein a lower portion of the fin structure within the device isolation layer has a tapered width.

13. The structure of claim 12, wherein the sidewalls of the fin structure above the device isolation layer are substantially vertical.

14. The structure of claim 13, wherein each of the sidewalls of the fin structure includes a transition point where the sidewall changes slope between a lower portion and an upper portion of the sidewall.

15. The structure of claim 1, wherein the semiconductor layer includes a semiconductor material different from the fin structure.

16. The structure of claim 1, wherein the substrate is a Silicon-on-insulator (SOI) substrate.

17. The structure of claim 1, wherein one of the fin structure and the semiconductor layer includes at least one of InSb, InAs, GaSb, InP, GaAs, AlGaAs, Ge, SiGe, and SiC.

18. A Field Effect Transistor (FET) structure, comprising:
a substrate;
a device isolation layer on the substrate;
a fin structure protruding upward from the substrate through the device isolation layer, the fin structure being doped with a first concentration of impurities; and
a semiconductor layer on an upper surface of the substrate beneath the device isolation layer and extending continuously to an upper surface and sidewalls of the fin structure, the semiconductor layer being doped with a second concentration of impurities that is different from the first concentration of impurities, wherein an upper surface of the device isolation layer has a level lower than an upper surface of the semiconductor layer on the upper surface of the fin structure.

19. A Field Effect Transistor (FET) structure, comprising:

a substrate;

a device isolation layer on the substrate;

a fin structure protruding upward from the substrate through the device isolation layer, the fin structure being doped with a first concentration of impurities; and a semiconductor layer between a surface of the substrate and a lower surface of the device isolation layer that faces the surface of the substrate, the semiconductor layer being doped with a second concentration of impurities that is different from the first concentration of impurities, wherein an upper surface of the device isolation layer has a level lower than an upper surface of the semiconductor layer on an upper surface of the fin structure.

* * * * *